(12) United States Patent
Chang et al.

(10) Patent No.: US 11,621,220 B2
(45) Date of Patent: Apr. 4, 2023

(54) ASSEMBLY STRUCTURE AND METHOD FOR MANUFACTURING THE SAME

(71) Applicant: Advanced Semiconductor Engineering, Inc., Kaohsiung (TW)

(72) Inventors: Yung-Shun Chang, Kaohsiung (TW); Chih-Pin Hung, Kaohsiung (TW); Teck-Chong Lee, Kaohsiung (TW); Chih-Yi Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 75 days.

(21) Appl. No.: 17/213,006

(22) Filed: Mar. 25, 2021

(65) Prior Publication Data

US 2022/0310500 A1 Sep. 29, 2022

(51) Int. Cl.
| | |
|---|---|
| *H01L 23/02* | (2006.01) |
| *H01L 23/498* | (2006.01) |
| *H01L 23/00* | (2006.01) |
| *H01L 23/544* | (2006.01) |
| *H01L 25/065* | (2023.01) |
| *H01L 21/48* | (2006.01) |
| *H01L 23/31* | (2006.01) |

(52) U.S. Cl.
CPC .... *H01L 23/49838* (2013.01); *H01L 21/4857* (2013.01); *H01L 23/3128* (2013.01); *H01L 23/49822* (2013.01); *H01L 23/49827* (2013.01); *H01L 23/544* (2013.01); *H01L 24/08* (2013.01); *H01L 25/0655* (2013.01); *H01L 2223/54426* (2013.01); *H01L 2224/08235* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0262644 | A1* | 12/2004 | Naruse | H05K 3/3442 257/734 |
| 2011/0316170 | A1* | 12/2011 | Muramatsu | H01L 23/49816 257/E21.585 |
| 2016/0056087 | A1* | 2/2016 | Wu | H01L 25/105 257/738 |

\* cited by examiner

*Primary Examiner* — Niki H Nguyen
(74) *Attorney, Agent, or Firm* — Foley & Lardner LLP

(57) ABSTRACT

An assembly structure and a method for manufacturing an assembly structure are provided. The assembly structure includes a wiring structure and a semiconductor element. The wiring structure includes at least one dielectric layer and at least one circuit layer in contact with the at least one dielectric layer, and defines an accommodating recess recessed from a top surface of the wiring structure. The wiring structure has a smooth surface extending from the top surface of the wiring structure to a surface of the accommodating recess. The semiconductor element is disposed in the accommodating recess.

17 Claims, 42 Drawing Sheets

ASSEMBLY STRUCTURE AND METHOD FOR MANUFACTURING THE SAME

BACKGROUND

1. Field of the Disclosure

The present disclosure relates to an assembly structure and a method, and to an assembly structure including a semiconductor element, and a method for manufacturing the assembly structure.

2. Description of the Related Art

The demand for consumer electronic products continues to increase, along with a demand for smaller and lighter products. In a conventional semiconductor package structure, a plurality of tall pillars and a semiconductor chip may be bonded to and electrically connected to a surface of a substrate. Then, a molding compound may be used to cover the tall pillars, the semiconductor chip and the surface of the substrate. As a result, a total thickness of the conventional package structure is relatively large. Correspondingly, it is desirable to reduce the total thickness of the conventional semiconductor package structure.

SUMMARY

In some embodiments, an assembly structure includes a wiring structure and a semiconductor element. The wiring structure includes at least one dielectric layer and at least one circuit layer in contact with the at least one dielectric layer, and defines an accommodating recess recessed from a top surface of the wiring structure. The wiring structure has a smooth surface extending from the top surface of the wiring structure to a surface of the accommodating recess. The semiconductor element is disposed in the accommodating recess.

In some embodiments, an assembly structure includes a wiring structure and a semiconductor element. The wiring structure includes at least one circuit layer disposed in a second portion of the wiring structure. The semiconductor element is embedded in a first portion of the wiring structure. A surface of the semiconductor element and an inner surface of the first portion of the wiring structure define a space. A depth of a first portion of the space is greater than a depth of a second portion of the space. The second portion of the space is nearer to the at least one circuit layer than the first portion of the space is.

In some embodiments, a method for manufacturing an assembly structure includes: (a) providing a carrier; (b) forming at least one dielectric layer and at least one circuit layer on the carrier to form a wiring structure, wherein the wiring structure includes a die attach portion and a circuit portion adjacent to the die attach portion, and a conductive-trace density of the circuit layer in the die attach portion is less than a conductive-trace density of the circuit layer in the circuit portion; and (c) disposing a semiconductor element on the die attach portion.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
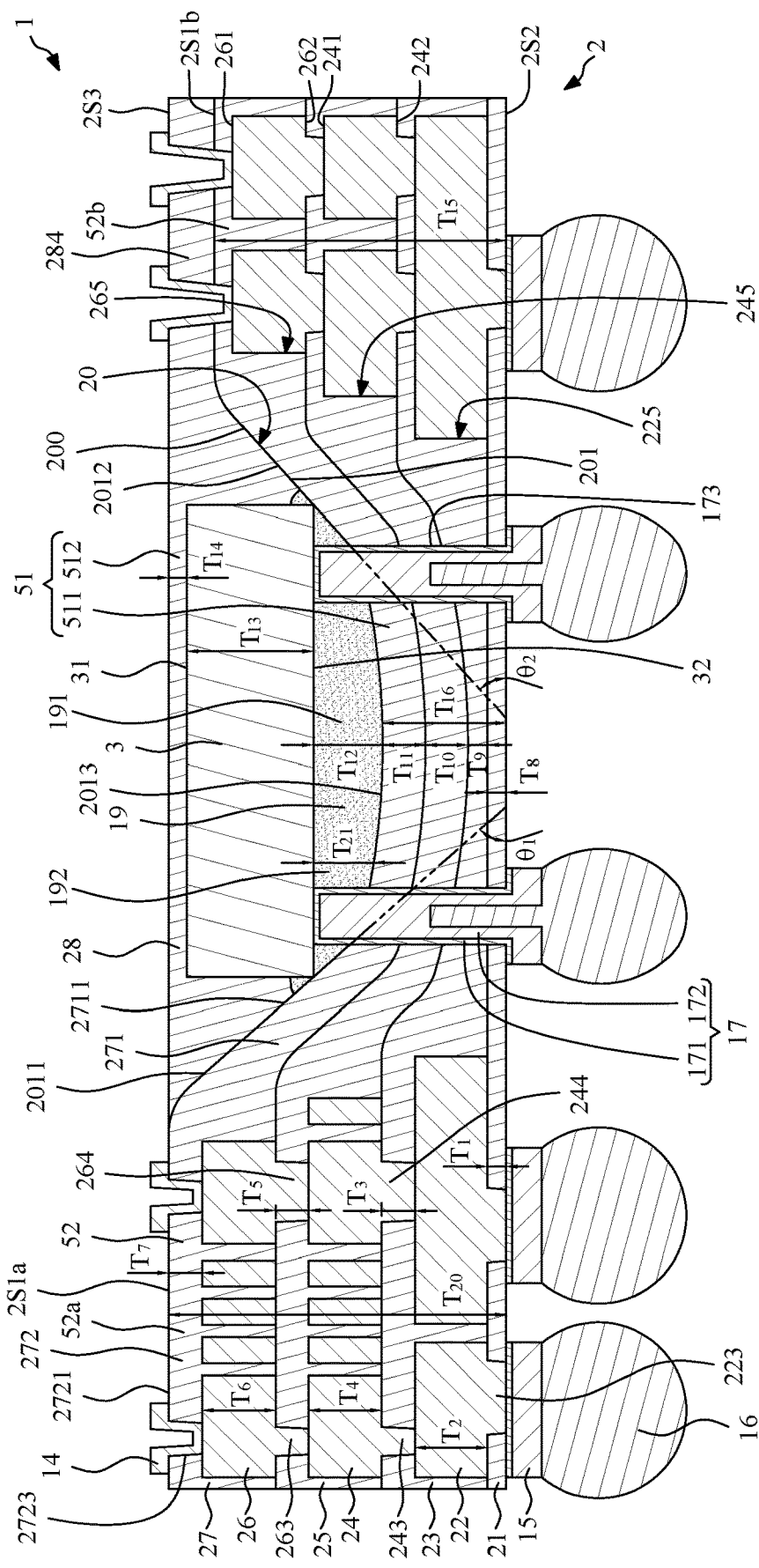
FIG. 1 illustrates a cross-sectional view of an assembly structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an assembly structure 1 according to some embodiments of the present disclosure. The assembly structure 1 may include a wiring structure 2, a semiconductor element 3, a protection material 28, a lower conductive structure (e.g., a redistribution layer 15), an upper conductive structure (e.g., a redistribution layer 14) and an external connector 16.

The wiring structure 2 may include a plurality of circuit layers, such as three circuit layers (e.g., a first circuit layer 22, a second circuit layer 24 and a third circuit layer 26). Each of the circuit layers may be a redistribution layer or a fan-out layer. In some embodiments, the wiring structure 2 may further include a plurality of dielectric layers, such as four dielectric layers (e.g., a first dielectric layer 21, a second dielectric layer 23, a third dielectric layer 25 and a fourth dielectric layer 27). However, in other embodiments, the wiring structure 2 may include more or less circuit layers and/or dielectric layers.

The first dielectric layer 21 may be a bottommost dielectric layer of the wiring structure 2. As shown in FIG. 1, the first dielectric layer 21 may be substantially planar. That is, a thickness of the first dielectric layer 21 may be substantially consistent.

The first circuit layer 22 is disposed on the first dielectric layer 21. The first circuit layer 22 may define a gap 225 that is greater than the width of the semiconductor element 3. As shown in FIG. 1, the first circuit layer 22 includes at least one conductive via 223 extending through the first dielectric layer 21 to form an external contact.

The second dielectric layer 23 is disposed on the first dielectric layer 21 and covers the first circuit layer 22. The second dielectric layer 23 may be conformal to the first circuit layer 22. For example, the second dielectric layer 23 may be applied in a liquid form by coating, or in a dry film form by laminating. The second dielectric layer 23 may be applied in a constant volume over the entire first dielectric layer 21 to cover the first circuit layer 22. Hence, the "topography" of the second dielectric layer 23 may be affected by the first circuit layer 22 disposed thereunder. That is, the "topography" of the second dielectric layer 23 may be descending at a position where the first circuit layer 22 is absent (e.g., the position of the gap 225). Accordingly, a top surface of the second dielectric layer 23 may not be flat or planar. In some embodiments, the top surface of the second dielectric layer 23 may define a recess portion at the position corresponding to the gap 225 after a curing process due to a shrinkage of the second dielectric layer 23. The top surface of the second dielectric layer 23 is a smooth surface that does not include any turning point. For example, no portion of the second dielectric layer 23 is removed (e.g., by matching, drilling or etching) during the manufacturing process.

The second circuit layer 24 is disposed on the second dielectric layer 23. The second circuit layer 24 may define a gap 245 that is greater than the width of the semiconductor element 3. The gap 245 of the second circuit layer 24 may be right above the gap 225 of the first circuit layer 22. As shown in FIG. 1, the second circuit layer 24 may include a first conductive via 243 and a second conductive via 244 extending through the second dielectric layer 23 to contact and electrically connect the first circuit layer 22. In some embodiments, a width of the second conductive via 244 may be greater than a width of the first conductive via 243.

The third dielectric layer 25 is disposed on the second dielectric layer 23 and covers the second circuit layer 24. The third dielectric layer 25 may be conformal to the second circuit layer 24 and the second dielectric layer 23. Similar to the second dielectric layer 23 described above, the "topography" of the third dielectric layer 25 may be descending at a position where the first circuit layer 22 and/or the second circuit layer 24 is omitted (e.g., the position of the gaps 225, 245). Accordingly, a top surface of the third dielectric layer 25 may not be flat or planar. In some embodiments, the top surface of the third dielectric layer 25 may define a recess portion at the position corresponding to the gaps 225, 245 after a curing process due to a shrinkage of the third dielectric layer 25. The top surface of the third dielectric layer 25 is a smooth surface that does not include any turning point. For example, no portion of the third dielectric layer 25 is removed (e.g., by matching, drilling or etching) during the manufacturing process.

The third circuit layer 26 is disposed on the third dielectric layer 25. The third circuit layer 26 is disposed on the third dielectric layer 25. The third circuit layer 26 may define a gap 265 that is greater than the width of the semiconductor element 3. The gap 265 of the third circuit layer 26 may be right above the gaps 225, 245. As shown in FIG. 1, the third circuit layer 26 may include a first conductive via 263 and a second conductive via 264 extending through the third dielectric layer 25 to contact and electrically connect the second dielectric layer 23. In some embodiments, a width of the second conductive via 264 may be greater than a width of the first conductive via 263.

The fourth dielectric layer 27 is disposed on the third dielectric layer 25 and covers the third circuit layer 26. The third dielectric layer 25 may be conformal to the third circuit layer 26 and the third dielectric layer 25. Similar to the third dielectric layer 25 described above, the "topography" of the fourth dielectric layer 27 may be descending at a position where the first circuit layer 22, the second circuit layer 24 and/or the third circuit layer 26 is omitted (e.g., the position of the gaps 225, 245, 265). Accordingly, a top surface of the fourth dielectric layer 27 may not be flat or planar. In some embodiments, the top surface of the fourth dielectric layer 27 may define a recess portion at the position corresponding to the gaps 225, 245, 265 after a curing process due to a shrinkage of the fourth dielectric layer 27. The top surface of the fourth dielectric layer 27 is a smooth surface that does not include any turning point. For example, no portion of the fourth dielectric layer 27 is removed (e.g., by matching, drilling or etching) during the manufacturing process.

In some embodiments, a material of the first dielectric layer 21, the second dielectric layer 23, the third dielectric layer 25 and the fourth dielectric layer 27 may include an insulating material, a passivation material, a dielectric material or a solder resist material, such as, for example, a benzocyclobutene (BCB) based polymer or a polyimide (PI). In some embodiments, a material of the first circuit layer 22, the second circuit layer 24 and the third circuit layer 26 may include a conductive metal such as copper, another conductive metal, or an alloy thereof.

The wiring structure 2 may include a first portion 51 and a second portion 52 surrounding the first portion 51. The first portion 51 may include a first lower portion 511, and may further include a first upper portion 512. The semiconductor element 3 is disposed in the first portion 51 and on the first lower portion 511. The circuit layers (e.g., the first circuit layer 22, the second circuit layer 24 and the third circuit layer 26) are disposed or embedded in the second portion 52. For example, there may be no horizontal circuit layer in the first portion 51 under the semiconductor element 3 (i.e., the first lower portion 511). The wiring structure 2 may have a top surface 2S1$a$, 2S1$b$ and a bottom surface 2S2 opposite to the top surface 2S1$a$, 2S1$b$. The wiring structure 2 may define an accommodating recess 20 recessed from the top surface 2S1$a$, 2S1$b$ of the wiring structure 2, and the semiconductor element 3 may be disposed in the accommodating recess 20.

In some embodiments, the fourth dielectric layer 27 (e.g., the topmost dielectric layer) include a first portion 271 corresponding to the first portion 51 of the wiring structure 2 and a second portion 272 corresponding to the second portion 52 of the wiring structure 2. As stated above, the first portion 271 of the fourth dielectric layer 27 may be recessed from the second portion 272 of the fourth dielectric layer 27 so as to define the accommodating recess 20. The entire accommodating recess 20 may be defined only by the fourth dielectric layer 27. Since the fourth dielectric layer 27 may shrink naturally after a curing process, a surface 201 of the accommodating recess 20 (i.e., a top surface of the first lower portion 511) and the top surface 2S1$a$, 2$s$1$b$ of the wiring structure 2 are smooth and continuous. That is, the wiring structure 2 has a smooth outer surface 200 extending from the top surface 2S1$a$, 2$s$1$b$ of the wiring structure 2 to the surface 201 of the accommodating recess 20. The outer surface 200 includes the top surface 2S1$a$, 2S1$b$ of the wiring structure 2 and the surface 201 of the accommodating recess 20. There is no sharp turning point from the top surface 2S1$a$, 2S2$b$ of the wiring structure 2 to the surface 201 of the accommodating recess 20. Thus, the accommodating recess 20 may be unrecognizable from a top view.

As shown in FIG. 1, the accommodating recess 20 is only defined by the fourth dielectric layer 27 (e.g., the topmost dielectric layer). The first dielectric layer 21, the second dielectric layer 23 and the third dielectric layer 25 do not extend to accommodating recess 20 and are not exposed in the accommodating recess 20. Thus, the sidewall of the accommodating recess 20 is the top surface of the fourth dielectric layer 27 (e.g., the topmost dielectric layer) that includes an upper surface 2711 of the first portion 271 of the topmost dielectric layer 27. The accommodating recess 20 is formed by continuous deformation or shrinkage of the fourth dielectric layer 27 (e.g., the topmost dielectric layer). The accommodating recess 20 may be not formed by machining.

The first portion 271 of the fourth dielectric layer 27 (e.g., the topmost dielectric layer) and the accommodating recess 20 may be disposed within the gaps 245, 265. An elevation of a bottom surface 32 of the semiconductor element 3 is lower than an elevation of a top surface 261 and a bottom surface 262 of the third circuit layer 26 (e.g., the topmost circuit layer). In some embodiments, an elevation of the bottom surface 32 of the semiconductor element 3 may be lower than an elevation of a top surface 241 and a bottom surface 242 of the second circuit layer 24.

As shown in FIG. 1, the second portion 52 of the wiring structure 2 may include a first region 52a and a second region 52b located on two sides of the semiconductor element 3 respectively. The first region 52a includes a high conductive-trace density region and the second region 52b includes a low conductive-trace density region. In some embodiments, a distribution density of the conductive trace(s) or line(s) of the circuit layer in the high conductive-trace density region is greater than a distribution density of the conductive trace(s) or line(s) of the circuit layer in a low conductive-trace density region. That is, the count of the conductive trace(s) or line(s) in a unit area of the high conductive-trace density region is greater than the count of the conductive trace(s) or line(s) in an equal unit area of the low conductive-trace density region, such as about 1.2 times or greater, about 1.5 times or greater, or about 2 times or greater, or about 3 times or greater. Alternatively, or in combination, a line width/line space (L/S) in the high conductive-trace density region is less than an L/S in the low conductive-trace density region, such as about 90% or less, about 70% or less, or about 50% or less.

The elevation of a top surface 2S1a of the first region 52a is different from the elevation of the top surface 2S1b of the second region 52b. For example, the elevation of the top surface 2S1a of the first region 52a is higher than the elevation of the top surface 2S1b of the second region 52b. The thickness $T_{20}$ of the first region 52a may be greater than the thickness $T_{15}$ of the second region 52b. The upper surface 2721 of the second portion 272 of the fourth dielectric layer 27 includes the top surface 2S1a of the first region 52a and the top surface 2S1b of the second region 52b.

As shown in FIG. 1, a number (or a count) of the dielectric layers 21, 23, 25, 27 in the first lower portion 511 is equal to a number (or a count) of the dielectric layers 21, 23, 25, 27 in the second portion 52 of the wiring structure 2. In addition, a thickness $T_{16}$ of the first lower portion 511 is less than a thickness of the second portion 52 (e.g., the thickness $T_{20}$ of the first region 52a or the thickness $T_{15}$ of the second region 52b). The thickness of the second portion 52 (e.g., the thickness $T_{20}$ of the first region 52a or the thickness $T_{15}$ of the second region 52b) may be a total thickness of the wiring structure 2. The embodiment illustrated in FIG. 1 may be a 4P3M (four PI dielectric layers and three metal circuit layers) structure, and a shrinkage rate of the PI dielectric layers may be 0.5 time. The shrinkage rate is defined as a ratio of a thickness of a dielectric layer after being cured to a thickness of the dielectric layer before being cured. In some embodiments, a thickness $T_1$ of the first dielectric layer 21 in the first region 52a is 5 μm, and a thickness $T_8$ of the first dielectric layer 21 in the first lower portion 511 is also 5 μm. A thickness $T_2$ of the first circuit layer 22 is 20 μm. A gap $T_3$ between the first circuit layer 22 and the second circuit layer 24 is 5 μm. A maximum thickness of the second dielectric layer 23 in the first region 52a is 25 μm (i.e., a sum of $T_2$ and $T_3$), and a minimum thickness $T_9$ of the second dielectric layer 23 in the first lower portion 511 is 12.5 μm due to the shrinkage rate of 0.5 time. A thickness $T_4$ of the second circuit layer 24 is 20 μm. A gap $T_5$ between the second circuit layer 24 and the third circuit layer 26 is 5 μm. A maximum thickness of the third dielectric layer 25 in the first region 52a is 25 μm (i.e., a sum of $T_4$ and $T_5$), and a minimum thickness $T_{10}$ of the third dielectric layer 25 in the first lower portion 511 is 12.5 μm due to the shrinkage rate of 0.5 time. A thickness $T_6$ of the third circuit layer 26 is 20 μm. A gap $T_7$ between the third circuit layer 26 and the top surface 2S1 is 5 μm. A maximum thickness of the fourth dielectric layer 27 in the first region 52a is 25 μm (i.e., a sum of $T_6$ and $T_7$), and a minimum thickness $T_{11}$ of the fourth dielectric layer 27 in the lower portion 511 is 12.5 μm due to the shrinkage rate of 0.5 time. Thus, a ratio of the minimum thickness $T_{16}$ of the first lower portion 511 (i.e., a sum of $T_8$, $T_9$, $T_{10}$, $T_{11}$) to the thickness Tao of the first region 52a of the second portion 52 is 42.5 μm/80 μm=0.531.

The surface 201 of the accommodating recess 20 may be also referred to as the sidewall of the accommodating recess 20, or the top surface of the first lower portion 511, or the upper surface 2711 of the first portion 271 of the topmost dielectric layer 27. The surface 201 of the accommodating recess 20 may include a first slanted surface 2011, a second slanted surface 2012 opposite to the first slanted surface 2011 and a receiving surface 2013 for receiving the semiconductor element 3. The first slanted surface 2011 and the second slanted surface 2012 are located on two sides of the semiconductor element 3 respectively. The receiving surface 2013 may extend between the first slanted surface 2011 and the second slanted surface 2012, and may be a curved surface (e.g., a concave surface). It is smooth and continuous from the top surface 2S1a of the first region 52a to the first slanted surface 2011, the receiving surface 2013, the second slanted surface 2012 and the top surface 2S1b of the second region 52b. A first angle θ1 between the first slanted surface 2011 and the bottom surface 2S2 of the wiring structure 2 may be different form a second angle θ2 between the second slanted surface 2012 and the bottom surface 2S2 of the wiring structure 2. As shown in FIG. 1, the first slanted surface 2011 corresponds to the first region 52a (i.e., the high conductive-trace density region), the second slanted surface 2012 corresponds to the second region 52b (e.g., the low conductive-trace density region), and the first angle θ1 is greater than the second angle θ2. However, in other embodiment, the first angle θ1 may be equal to the second angle θ2.

The semiconductor element 3 (e.g., a semiconductor die or a semiconductor chip) may be disposed in the accommodating recess 20. The semiconductor element 3 may have a top surface 31 and a bottom surface 32 opposite to the top surface 31. The bottom surface 32 of the semiconductor element 3 may be disposed on or attached to the receiving surface 2013 of the accommodating recess 20 through a buffer layer 19. The bottom surface 32 of the semiconductor element 3 may be an active surface. A thickness $T_{13}$ of the semiconductor element 3 may be 25 μm. The thickness $T_{13}$ of the semiconductor element 3 may be less than two times the thickness of one of the circuit layers 22, 24, 26.

The buffer layer 19 is disposed between the bottom surface 32 of the semiconductor element 3 and the surface 201 of the accommodating recess 20. The buffer layer 19 may be an adhesion layer, and may provide a buffer between the semiconductor element 3 and the wiring structure 2. As shown in FIG. 1, a thickness $T_{12}$ of a central portion 191 of the buffer layer 19 is greater than a thickness $T_{21}$ of a peripheral portion 192 of the buffer layer 19. The thickness $T_{12}$ of the buffer layer 19 may be 7.5 μm.

The protection material 28 may be disposed in the accommodating recess 20 to cover and encapsulate the semiconductor element 3 and the buffer layer 19. A material of the protection material 28 may be same as or different from a material of the dielectric layers 21, 23, 25, 27. A material of the protection material 28 may be molding compound, solder resist or photoresist. A portion of the protection material 28 on the semiconductor element 3 is a first upper portion 512 of the first portion 51. A thickness $T_{14}$ of the first upper portion 512 may be 5 µm. An extending portion 284 of the protection material 28 may cove the top surface 2S1b of the second region 52b to form a top surface 2S3.

The lower conductive structure (e.g., the redistribution layer 15) is disposed on the bottom surface 2S2 of the wiring structure 2 and is electrically connected to and in contact with the conductive via 223 of the first circuit layer 22. The lower conductive structure (e.g., the redistribution layer 15) may include a conductive through via 17 extending through the first lower portion 511 of the first portion 51 of the wiring structure 2 and the buffer layer 19 so as to electrically connect and contact the bottom surface 32 of the semiconductor element 3. A side surface 173 of the conductive through via 17 is a continuous surface. The conductive through via 17 may include a seed layer 171 and a conductive material 172. The external connector 16 (e.g., solder material) is bonded to and connected to the lower conductive structure (e.g., the redistribution layer 15) for external connection purpose.

The upper conductive structure (e.g., a redistribution layer 14) is disposed on the top surface 2S1a of the first region 52a of the wiring structure 2 and the top surface 2S3 of the protection material 28, and is electrically connected to and in contact with the third circuit layer 26 through the opening 2723 of the fourth dielectric layer 27 and the protection material 28.

In some embodiments, as shown in FIG. 1, the semiconductor element 3 is embedded in the assembly structure 1, thus, the total thickness of the assembly structure 1 as a package structure is reduced. Further, the accommodating recess 20 may be formed by continuous deformation or shrinkage of the dielectric layers 23, 25, 27 rather than by machining (e.g., laser drilling or lithography process), thus, the manufacturing cost may be reduced. In addition, the material of all of the dielectric layers 23, 25, 27 and the protection material 28 may be PI, thus, the CTE (coefficient of thermal expansion) mismatch between the semiconductor element 3, the dielectric layers 23, 25, 27 and the protection material 28 may be relatively low, which results in less warpage of the assembly structure 1.

In some embodiment, when the shrinkage rate of the dielectric layers 21, 23, 25, 27 is 0.4 time. Thus, each of the thickness $T_9$ of the second dielectric layer 23 in the first lower portion 511, the thickness $T_{10}$ of the third dielectric layer 25 in the first lower portion 511, and the thickness $T_{11}$ of the fourth dielectric layer 27 in the lower portion 511 is 10 µm. Thus, a ratio of the thickness $T_{16}$ of the first lower portion 511 (i.e., a sum of $T_8$, $T_9$, $T_{10}$, $T_{11}$) to the thickness $T_{20}$ of the first region 52a of the second portion 52 is 35 µm/80 µm=0.438.

In some embodiment, when the shrinkage rate of the dielectric layers 21, 23, 25, 27 is 0.3 time. Thus, each of the thickness $T_9$ of the second dielectric layer 23 in the first lower portion 511, the thickness $T_{10}$ of the third dielectric layer 25 in the first lower portion 511, and the thickness $T_{11}$ of the fourth dielectric layer 27 in the lower portion 511 is 7.5 µm. Thus, a ratio of the thickness $T_{16}$ of the first lower portion 511 (i.e., a sum of $T_8$, $T_9$, $T_{10}$, $T_{11}$) to the thickness $T_{20}$ of the first region 52a of the second portion 52 is 27.5 µm/80 µm=0.344.

In some embodiment, when the shrinkage rate of the dielectric layers 21, 23, 25, 27 is 0.2 time. Thus, each of the thickness $T_9$ of the second dielectric layer 23 in the first lower portion 511, the thickness $T_{10}$ of the third dielectric layer 25 in the first lower portion 511, and the thickness $T_{11}$ of the fourth dielectric layer 27 in the lower portion 511 is 5 µm. Thus, a ratio of the thickness $T_{16}$ of the first lower portion 511 (i.e., a sum of $T_8$, $T_9$, $T_{10}$, $T_{11}$) to the thickness $T_{20}$ of the first region 52a of the second portion 52 is 20 µm/80 µm=0.25.

In some embodiment, when the shrinkage rate of the dielectric layers 21, 23, 25, 27 is 0.1 time. Thus, each of the thickness $T_9$ of the second dielectric layer 23 in the first lower portion 511, the thickness $T_{10}$ of the third dielectric layer 25 in the first lower portion 511, and the thickness $T_{11}$ of the fourth dielectric layer 27 in the lower portion 511 is 2.5 µm. Thus, a ratio of the thickness $T_{16}$ of the first lower portion 511 (i.e., a sum of $T_8$, $T_9$, $T_{10}$, $T_{11}$) to the thickness $T_{20}$ of the first region 52a of the second portion 52 is 12.5 µm/80 µm=0.156.

Figure 1A:
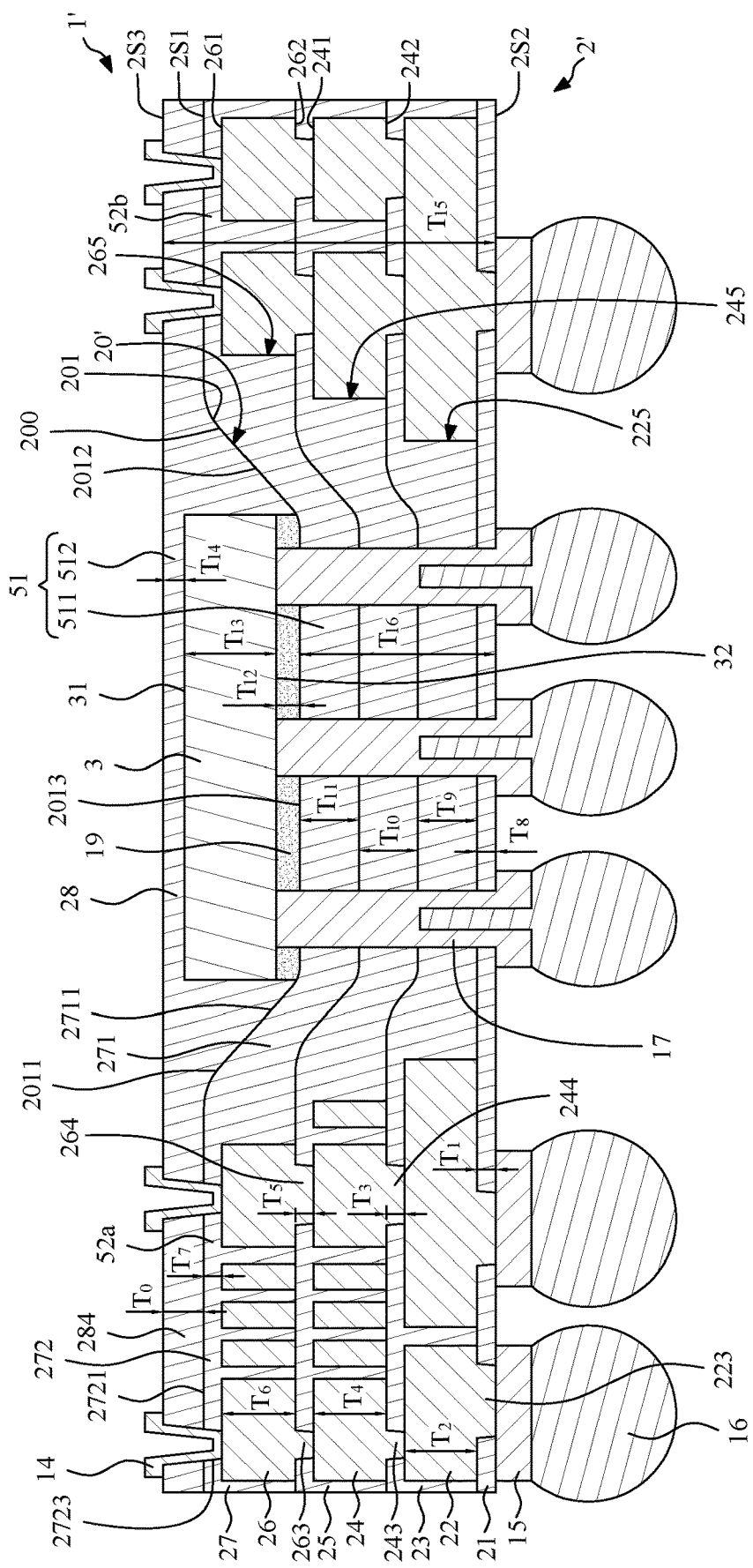
FIG. 1A illustrates a cross-sectional view of an assembly structure according to some embodiments of the present disclosure.

FIG. 1A illustrates a cross-sectional view of an assembly structure 1' according to some embodiments of the present disclosure. The assembly structure 1' is similar to the assembly structure 1 shown in FIG. 1, except a structure of the wiring structure 2'. In the wiring structure 2', the receiving surface 2013 of the accommodating recess 20 is a substantially flat plane, and the thickness of the first region 52a is equal to the thickness of the second region 52b, which is $T_{15}$. Thus, a slope of the first slanted surface 2011 may substantially equal to a slope of the second slanted surface 2012. As shown in FIG. 1A, the shrinkage rate of the dielectric layers 21, 23, 25, 27 may be 0.65 time. Thus, a thickness $T_9$ of the second dielectric layer 23 in the first lower portion 511 is 16.25 µm, a thickness $T_{10}$ of the third dielectric layer 25 in the first lower portion 511 is 16.25 µm, and a thickness $T_{11}$ of the fourth dielectric layer 27 in the lower portion 511 is 16.25 µm.

In addition, an elevation of the top surface 31 of the semiconductor element 3 is higher than an elevation of the top surface 2S1 of the wiring structure 2 or the upper surface 2721 of the second portion 272 of the fourth dielectric layer 27 (e.g., the topmost dielectric layer). Thus, the extending portion 284 of the protection material 28 may extend to cover the top surface 2S1 of the wiring structure 2 or the upper surface 2721 of the second portion 272 of the fourth dielectric layer 27 (e.g., the topmost dielectric layer). The second portion 52 of the wiring structure 2' may further include the extending portion 284 of the protection material 28. The thickness $T_{14}$ of the first upper portion 512 may be 5 µm. A thickness $T_0$ of the extending portion 284 of the protection material 28 may be 11.25 µm. Thus, a ratio of the thickness $T_{16}$ of the first lower portion 511 (i.e., a sum of $T_8$, $T_9$, $T_{10}$, $T_{11}$) to the thickness $T_{15}$ of the second portion 52 (including the extending portion 284 of the protection material 28) is 53.75 µm/91.25 µm=0.589. A ratio of the thickness $T_{16}$ of the first lower portion 511 (i.e., a sum of $T_8$, $T_9$, $T_{10}$, $T_{11}$) to the thickness $T_{15}$ of the second portion 52 (without the extending portion 284 of the protection material 28) is 53.75 µm/80 µm=0.67

Figure 1B:
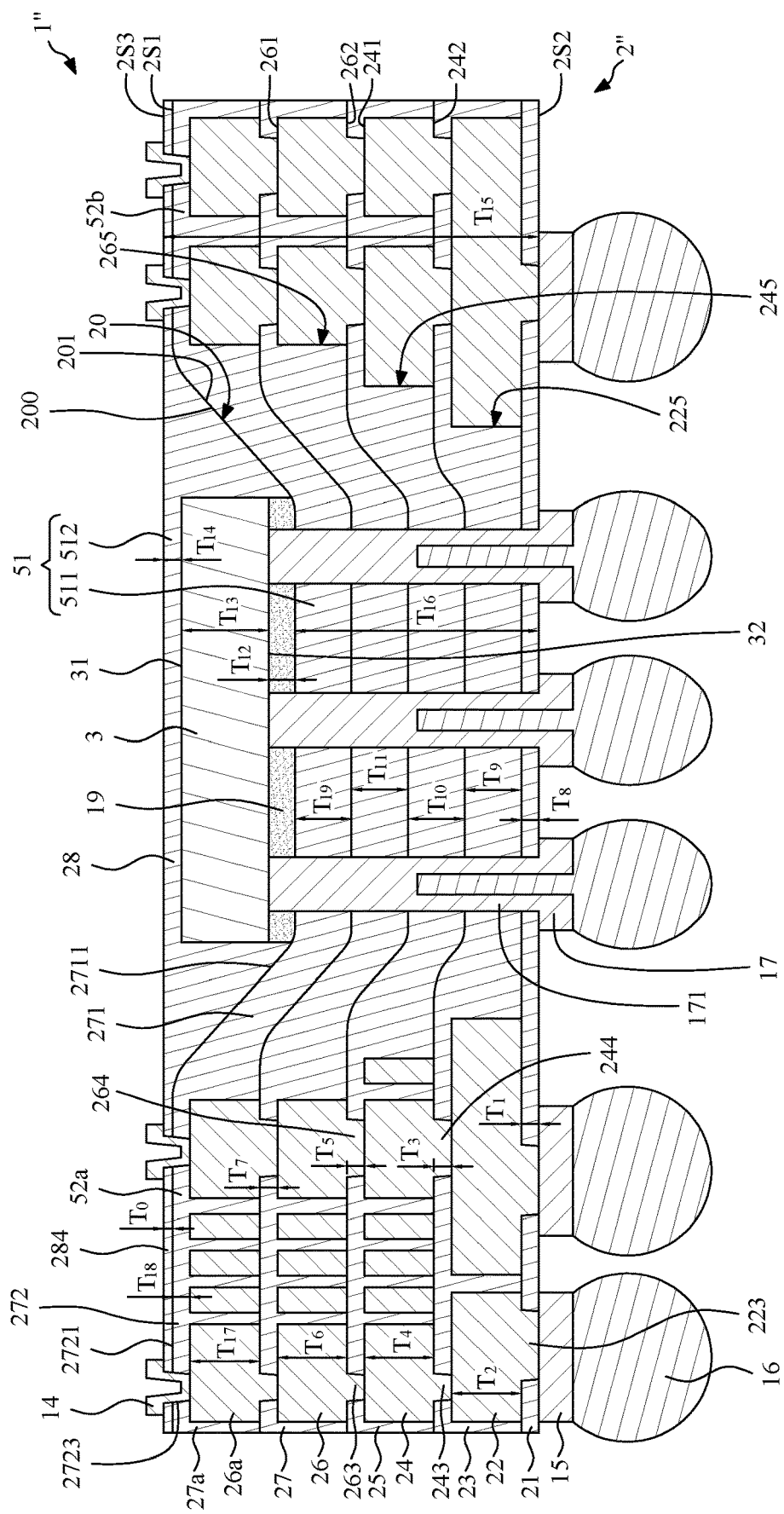
FIG. 1B illustrates a cross-sectional view of an assembly structure according to some embodiments of the present disclosure.

FIG. 1B illustrates a cross-sectional view of an assembly structure 1" according to some embodiments of the present disclosure. The assembly structure 1" is similar to the assembly structure 1' shown in FIG. 1A, except that the wiring structure 2" further include a fourth circuit layer 26a and a fifth dielectric layer 27a disposed on the fourth dielectric layer 27. The wiring structure 2" is a 5P4M structure. A thickness $T_{17}$ of the fourth circuit layer 26a is 20 µm. A gap $T_{18}$ between the fourth circuit layer 26a and the top surface 2S1 is 5 µm. A thickness $T_{19}$ of the fifth dielectric layer 27a in the lower portion 511 is 16.25 µm. A thickness $T_0$ of the extending portion 284 of the protection material 28 may be 2.5 µm. Thus, a ratio of the thickness $T_{16}$ of the first lower portion 511 (i.e., a sum of $T_8$, $T_9$, $T_{10}$, $T_{11}$, $T_{19}$) to the thickness $T_{15}$ of the second portion 52 (including the extending portion 284 of the protection material 28) is 70 µm/107.5 µm=0.651. A ratio of the thickness $T_{16}$ of the first lower portion 511 (i.e., a sum of $T_8$, $T_9$, $T_{10}$, $T_{11}$, $T_{19}$) to the thickness $T_{15}$ of the second portion 52 (without the extending portion 284 of the protection material 28) is 70 µm/105 µm=0.67.

In some embodiment, the number (count) of the dielectric layers and the circuit layers may be greater than five or less than four. As stated above, a ratio of the thickness of the first lower portion 511 to the thickness of the second portion 52 is in a range from 0.156 to 0.67. In some embodiment, the ratio of the thickness of the first lower portion 511 to the thickness of the second portion 52 may be substantially equal to or less than 0.589. In some embodiment, the ratio of the thickness of the first lower portion 511 to the thickness of the second portion 52 may be substantially equal to or greater than 0.156.

Figure 1C:
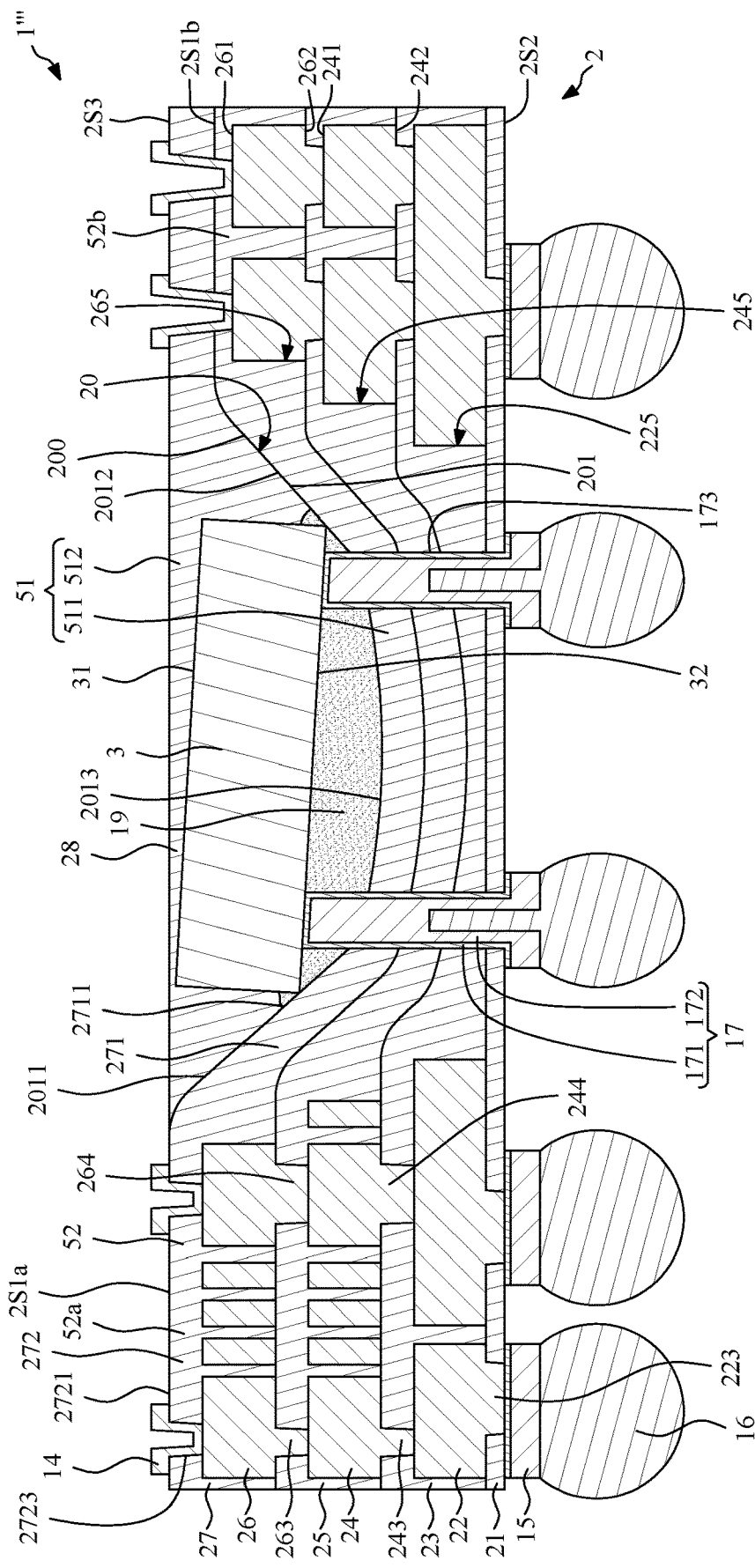
FIG. 1C illustrates a cross-sectional view of an assembly structure according to some embodiments of the present disclosure.

FIG. 1C illustrates a cross-sectional view of an assembly structure 1''' according to some embodiments of the present disclosure. The assembly structure 1''' is similar to the assembly structure 1 shown in FIG. 1, except that the semiconductor element 3 tilts.

Figure 2:
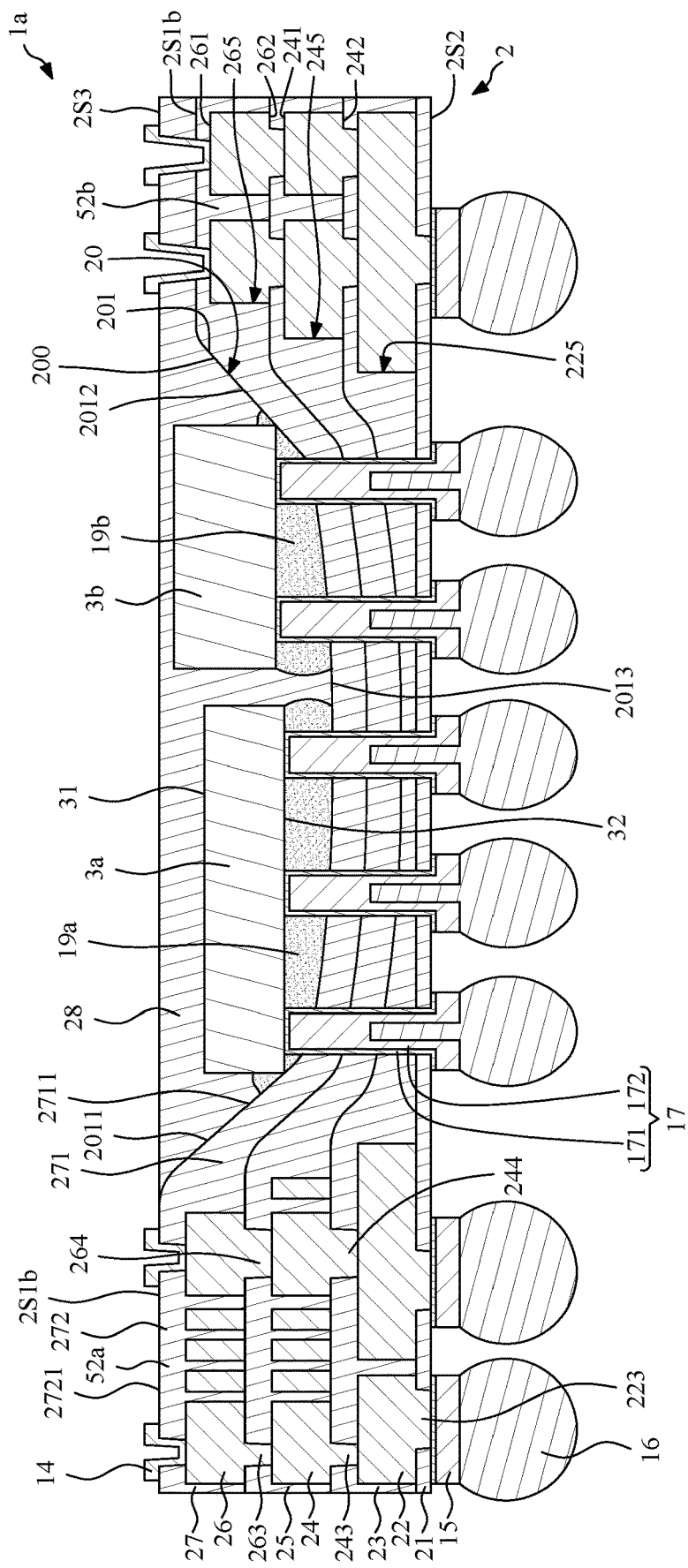
FIG. 2 illustrates a cross-sectional view of an assembly structure according to some embodiments of the present disclosure.

FIG. 2 illustrates a cross-sectional view of an assembly structure 1a according to some embodiments of the present disclosure. The assembly structure 1a is similar to the assembly structure 1 shown in FIG. 1, except that a plurality of semiconductor elements (including a first semiconductor element 3a and a second semiconductor element 3b) are disposed side by side in the accommodating recess 20. The first semiconductor element 3a may be also referred to as "another semiconductor element", and may be disposed on or attached to the receiving surface 2013 of the accommodating recess 20 through a first buffer layer 19a. The second semiconductor element 3b may be also referred to as "a semiconductor element", and may be disposed on or attached to the receiving surface 2013 of the accommodating recess 20 through a second buffer layer 19b. A thickness of the first semiconductor element 3a may be equal to or different from a thickness of the second semiconductor elements 3b. An elevation of the first semiconductor element 3a may be equal to or different from an elevation of the second semiconductor elements 3b.

Figure 2A:
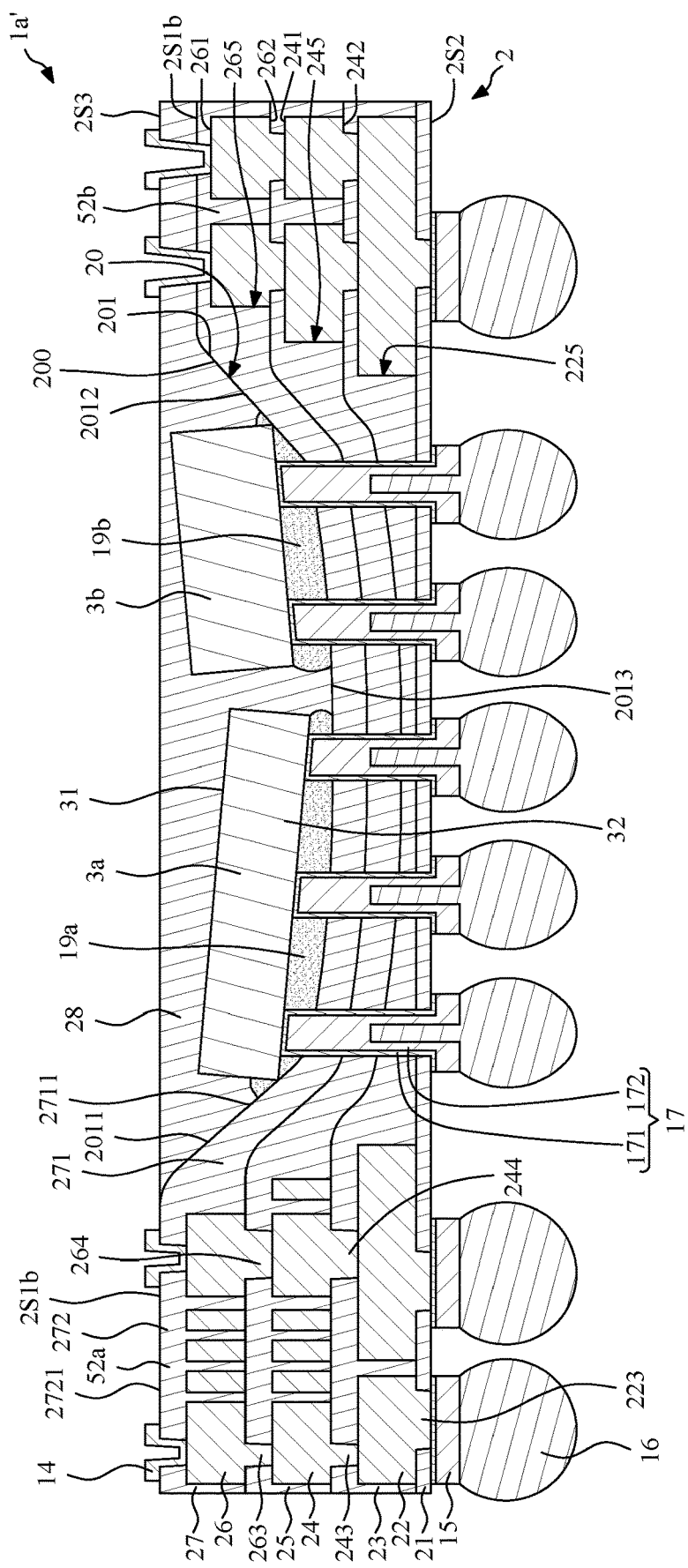
FIG. 2A illustrates a cross-sectional view of an assembly structure according to some embodiments of the present disclosure.

FIG. 2A illustrates a cross-sectional view of an assembly structure 1a' according to some embodiments of the present disclosure. The assembly structure 1a' is similar to the assembly structure 1a shown in FIG. 2, except that both of the first semiconductor element 3a and the second semiconductor elements 3b tilt.

Figure 3:
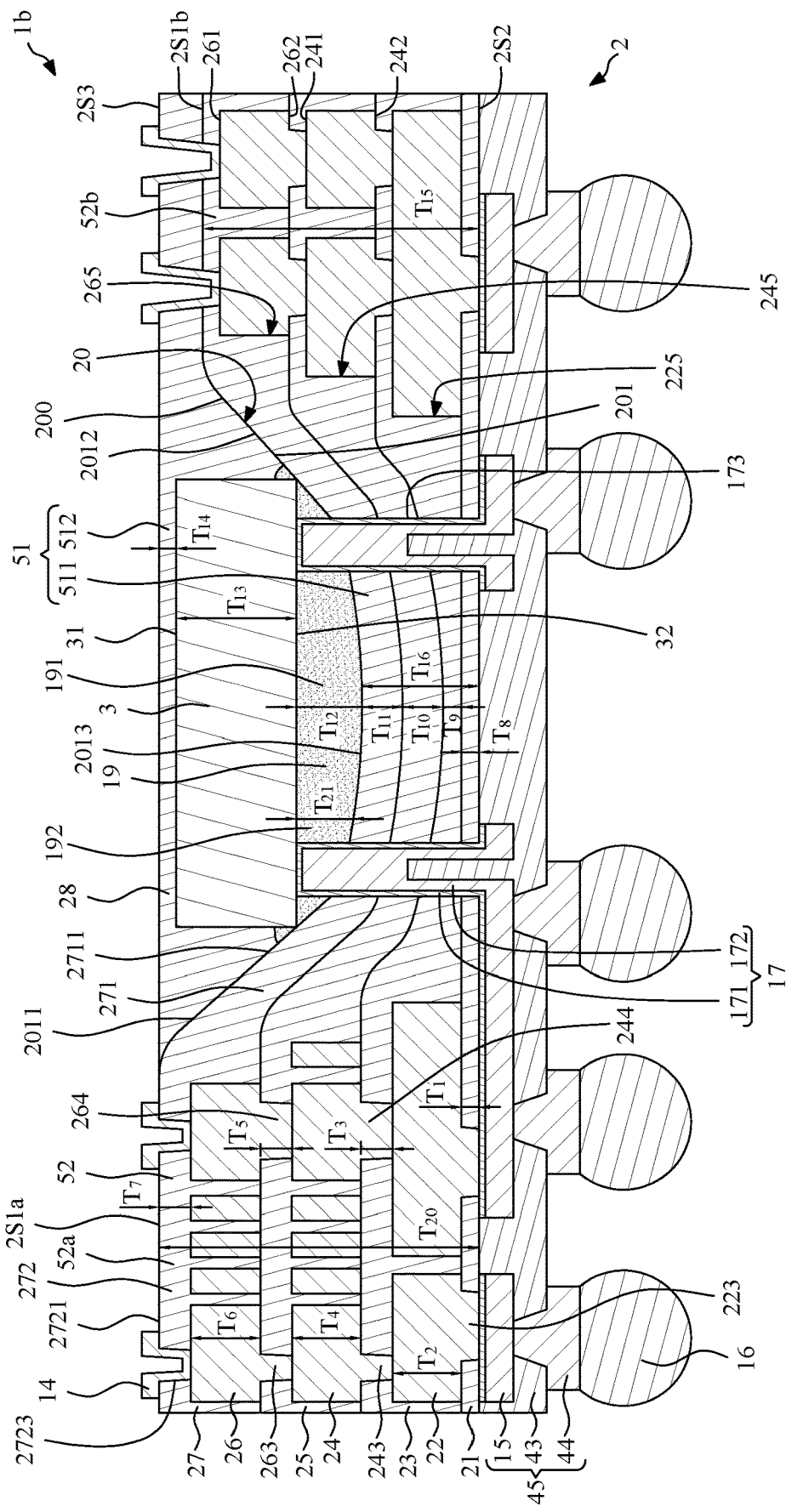
FIG. 3 illustrates a cross-sectional view of an assembly structure according to some embodiments of the present disclosure.

FIG. 3 illustrates a cross-sectional view of an assembly structure 1b according to some embodiments of the present disclosure. The assembly structure 1b is similar to the assembly structure 1 shown in FIG. 1, except for a structure of the lower conductive structure 45. The lower conductive structure 45 may include the redistribution layer 15, a dielectric layer 43 covering the redistribution layer 15 and a conductive layer 44 electrically connected to the redistribution layer 15. The external connector 16 is bonded to and connected to the conductive layer 44 of the lower conductive structure 45.

Figure 4:
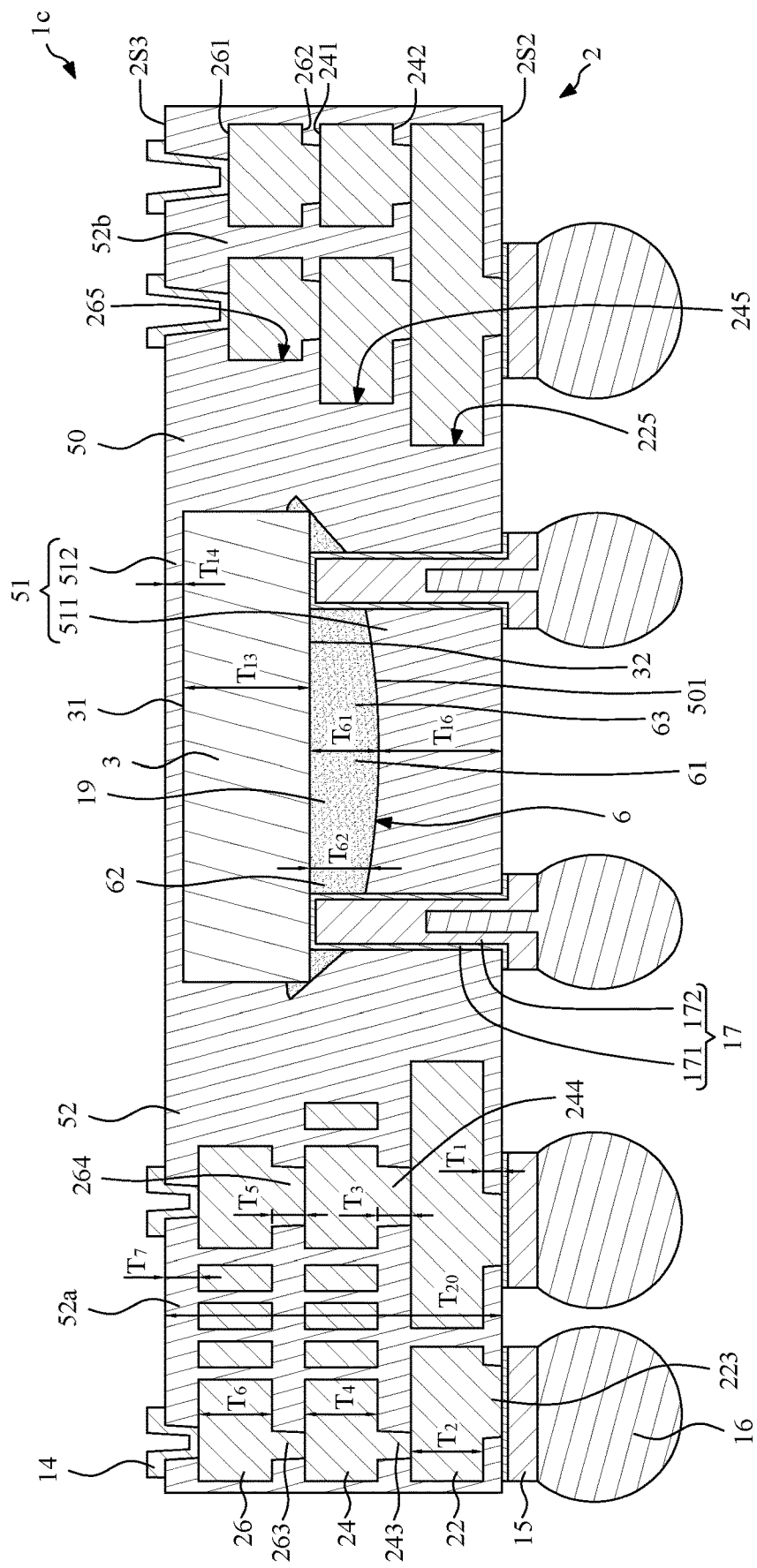
FIG. 4 illustrates a cross-sectional view of an assembly structure according to some embodiments of the present disclosure.

FIG. 4 illustrates a cross-sectional view of an assembly structure 1c according to some embodiments of the present disclosure. The assembly structure 1c is similar to the assembly structure 1 shown in FIG. 1, except that the wiring structure 2 and the protection material 28 are molten together to form a main body 50. The material of all of the dielectric layers 23, 25, 27 and the protection material 28 may be the same such as PI. The main body 50 may be a homogeneous material. There may be no boundaries between the first dielectric layer 21, the second dielectric layer 23, the third dielectric layer 25, the fourth dielectric layer 27 and the protection material 28. Alternatively, the boundaries between the first dielectric layer 21, the second dielectric layer 23, the third dielectric layer 25, the fourth dielectric layer 27 and the protection material 28 may be not obvious from a cross-sectional view. The main body 50 may include the first portion 51 and the second portion 52 surrounding the first portion 51. The first portion 51 may include the first lower portion 511 under the semiconductor element 3 and the first upper portion 512 over the semiconductor element 3. The semiconductor element 3 is embedded in the first portion 51. The circuit layers (e.g., the first circuit layer 22, the second circuit layer 24 and the third circuit layer 26) are embedded in the second portion 52. A ratio of a thickness of the first portion 51 of the main body 50 excluding the semiconductor element 3 and the buffer layer 19 (e.g., a sum of $T_{16}$ and $T_{14}$) to a thickness $T_{15}$ of the second portion 52 of the main body 50 may be 0.594.

The bottom surface 32 of the semiconductor element 3 and an inner surface 501 (corresponding to the receiving surface 2013) of the first portion 51 of the wiring structure 2 define a space 6. A depth $T_{61}$ of a first portion 61 of the space 6 is greater than a depth $T_{62}$ of a second portion 62 of the space 6. The second portion 62 of the space 6 is nearer to the at least one circuit layer 22, 24, 26 than the first portion 61 of the space is. The inner surface 501 of the first portion 51 of the wiring structure 2 includes a curved surface. The buffer layer 19 is disposed in the space 6.

In some embodiment, if the wiring structure 2" and the protection material 28 of the assembly structure 1" of FIG. 1B are molten together to form a main body, a ratio of a thickness of the first portion 51 of the main body excluding the semiconductor element 3 and the buffer layer 19 (e.g., a sum of $T_{16}$ and $T_{14}$) to a thickness $T_{15}$ of the second portion 52 of the main body may be 0.698. Thus, as stated above, a ratio of a thickness of the first portion 51 of the main body excluding the semiconductor element 3 to a thickness of the second portion 52 of the main body is in a range from 0.594 to 0.698. In addition, a ratio of a distance (i.e., the thickness $T_{16}$) between the inner surface 501 of the first portion 51 of the wiring structure 2 and a bottom surface 2S2 of the assembly structure 1c to a thickness Tao of the total assembly structure 1c is in a range from 0.156 to 0.67. In addition, a ratio of a thickness of the first portion 51 of the wiring structure 2 excluding the semiconductor element 3 (i.e., $T_{14}+T_{16}$) to a thickness $T_{20}$ of the total assembly structure 2c is in a range from 0.15 to 0.714.

In addition, a ratio of a gap $T_3$ or $T_5$ between the circuit layers 22, 24, 26 to a thickness Ta, $T_4$ or $T_6$ of the circuit layer 22, 24, 26 is in a range from 0.25 to 0.714. Further, a ratio of a sum of a gap $T_3$ or $T_5$ between the circuit layers 22, 24, 26 and a thickness $T_2$, $T_4$ or $T_6$ of a circuit layer 22, 24, 26 to a thickness $T_{16}$ of the first lower portion 511 under the semiconductor element 3 is in a range from 0.07 to 0.4.

Figure 4A:
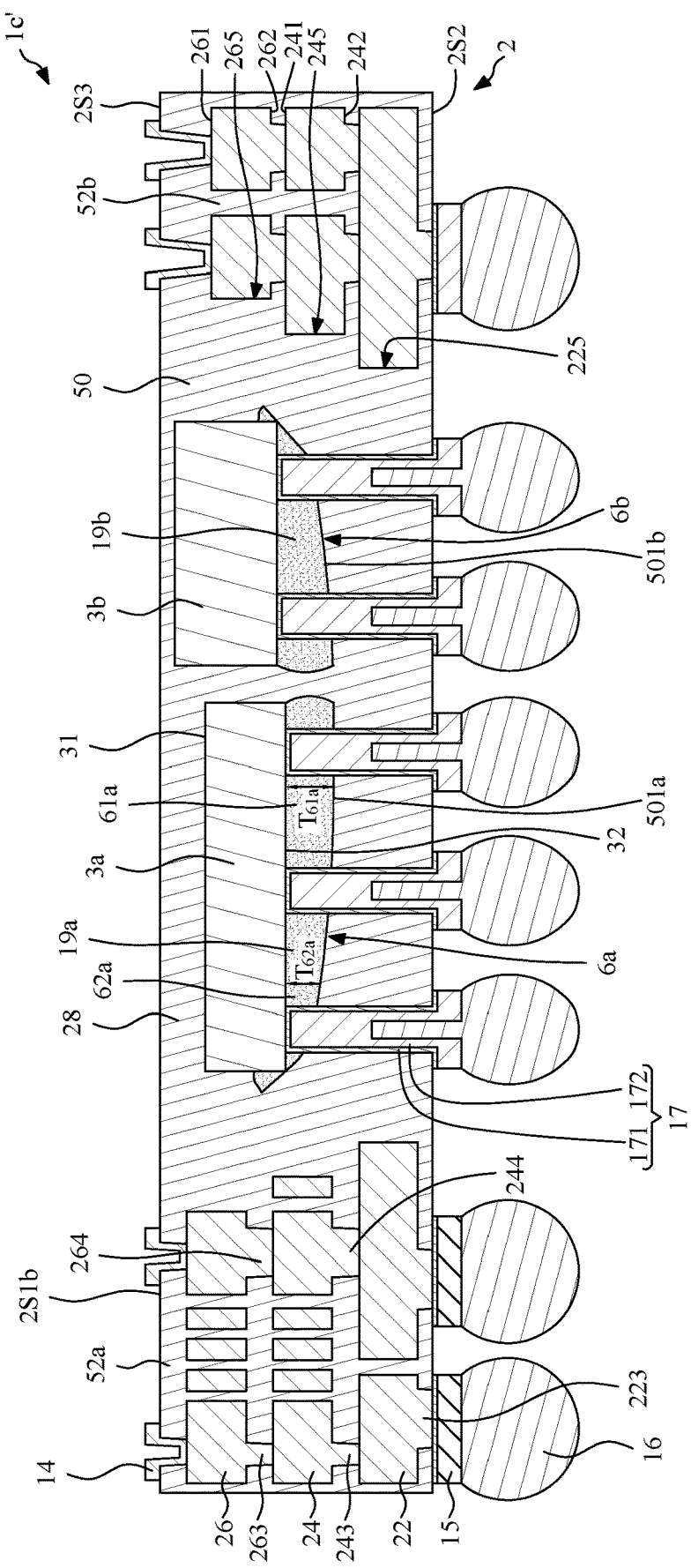
FIG. 4A illustrates a cross-sectional view of an assembly structure according to some embodiments of the present disclosure.

FIG. 4A illustrates a cross-sectional view of an assembly structure 1c' according to some embodiments of the present disclosure. The assembly structure 1c' is similar to the assembly structure 1a shown in FIG. 2, except that the wiring structure 2 and the protection material 28 are molten together to form a main body 50.

The bottom surface 32 of the first semiconductor element 3a (also referred to as "another semiconductor element") and the first inner surface 501a (corresponding to the receiving surface 2013) of the wiring structure 2 define a first space 6a (also referred to as "another space"). The bottom surface 32 of the second semiconductor element 3b (also referred to as "a semiconductor element") and the second inner surface 501b (corresponding to the receiving surface 2013) of the wiring structure 2 define a second space 6b (also referred to as "a space"). A depth $T_{61a}$ of a third portion 61a of the first space 6a is greater than a depth $T_{62a}$ of a fourth portion 62a of the first space 6a. The third portion 61a of the first space 6a is nearer to the adjacent second semiconductor element 3b than the fourth portion 62a of the first space 6a is. A first buffer layer 19a is disposed in the first space 6a, and a second buffer layer 19b is disposed in the second space 6b.

Figure 5:
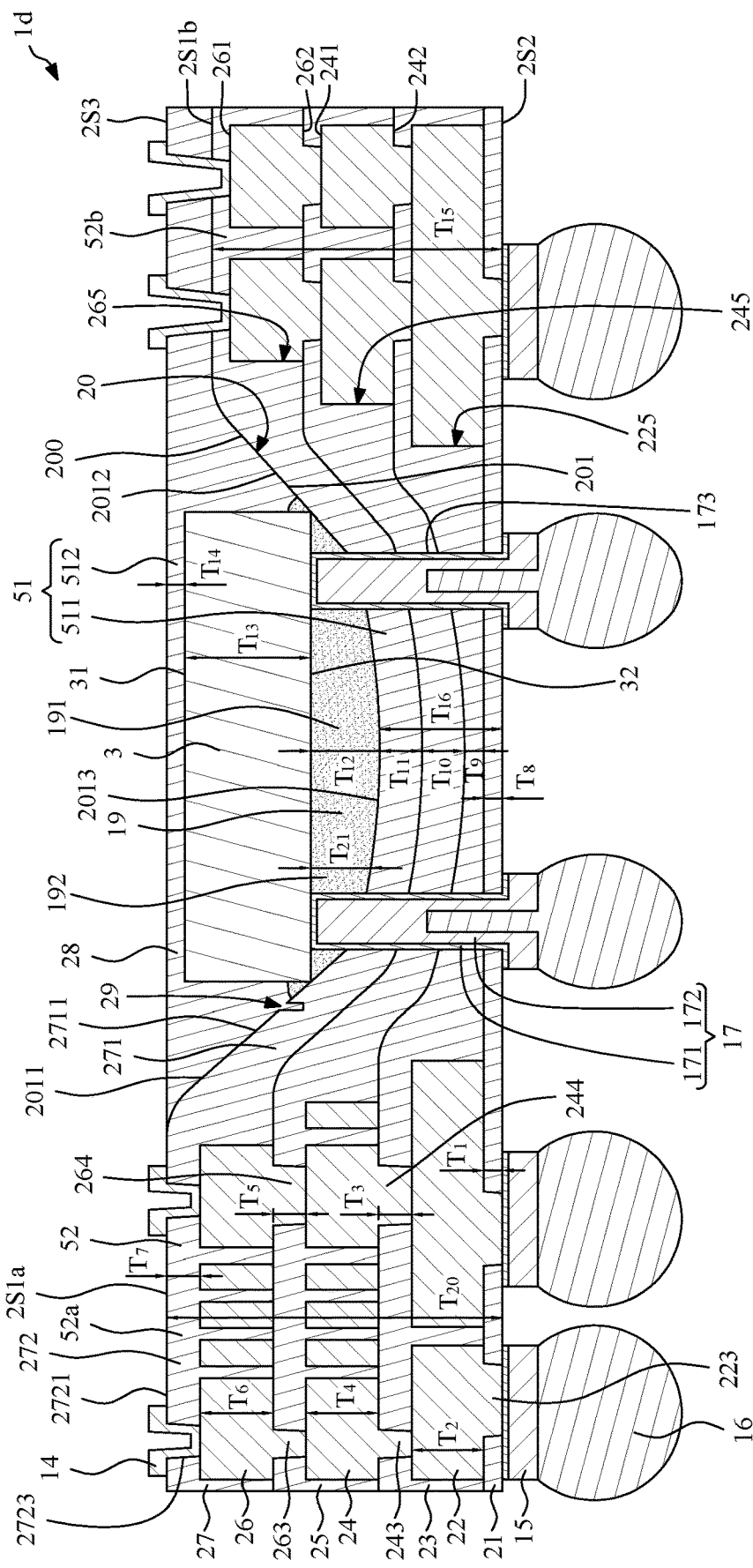
FIG. 5 illustrates a cross-sectional view of an assembly structure according to some embodiments of the present disclosure.

FIG. 5 illustrates a cross-sectional view of an assembly structure 1d according to some embodiments of the present disclosure. The assembly structure 1d is similar to the assembly structure 1 shown in FIG. 1, except that a fiducial mark 29 is further included in the wiring structure 2. The fiducial mark 29 may be disposed in the accommodating recess 20. As shown in FIG. 5, the fiducial mark 29 is an opening defined by the fourth dielectric layer 27 (e.g., a topmost dielectric layer of the dielectric layers 21, 23, 25, 27). That is, the fiducial mark 29 is an opening recess from the surface 201 of the accommodating recess 20.

Figure 6:
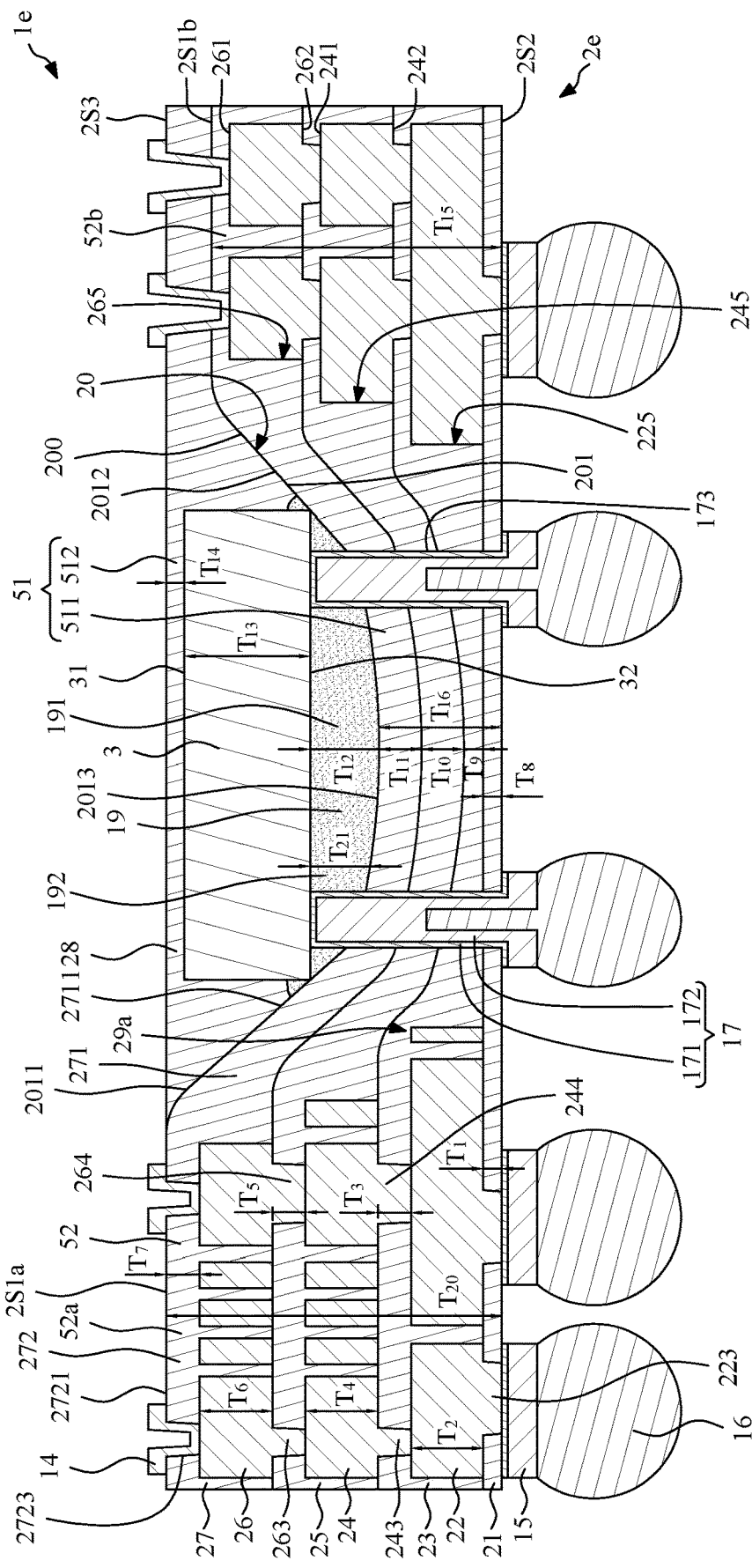
FIG. 6 illustrates a cross-sectional view of an assembly structure according to some embodiments of the present disclosure.

FIG. 6 illustrates a cross-sectional view of an assembly structure 1e according to some embodiments of the present disclosure. The assembly structure 1e is similar to the assembly structure 1 shown in FIG. 1, except that a fiducial mark 29a is further included in the wiring structure 2e. The fiducial mark 29a may be a portion of one of the circuit layers 22, 24, 26, and may be disposed adjacent to the accommodating recess 20. The fiducial mark 29a may be seen or recognized from a top view.

Figure 7:
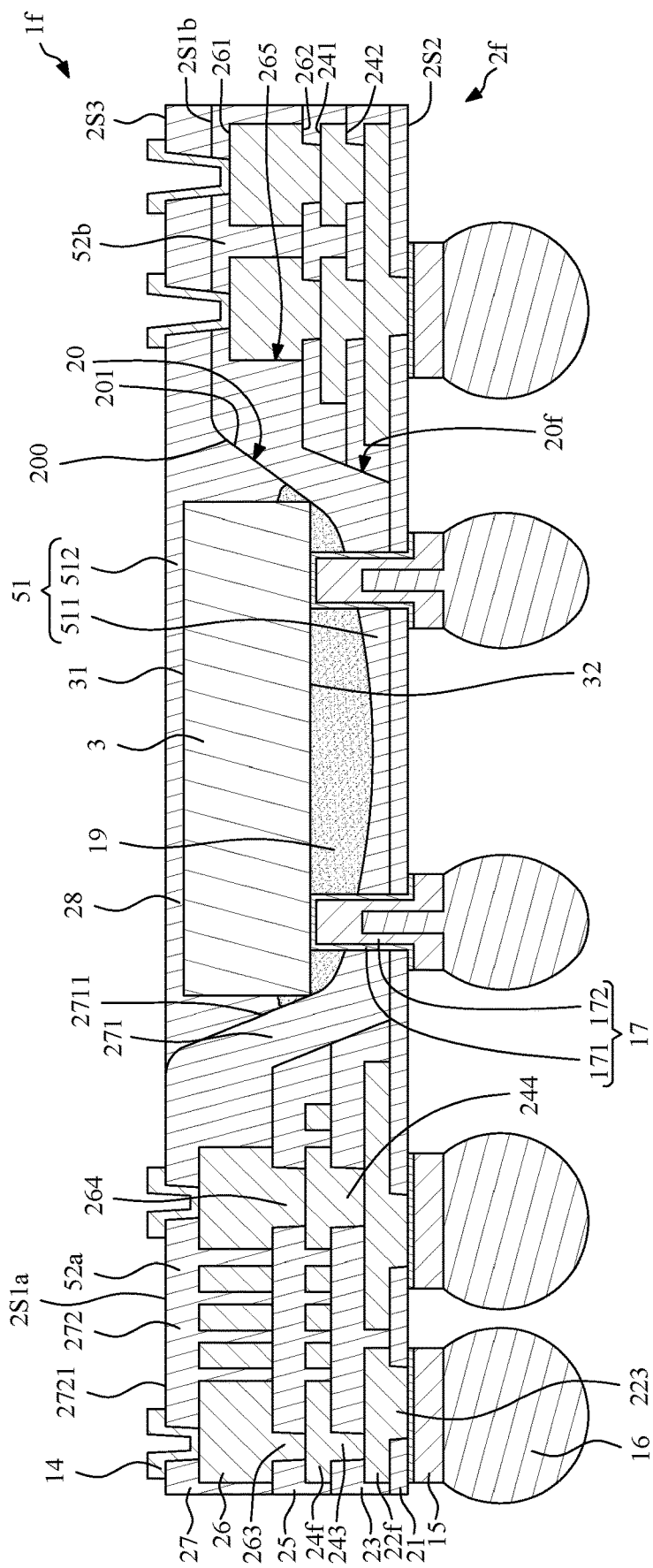
FIG. 7 illustrates a cross-sectional view of an assembly structure according to some embodiments of the present disclosure.

FIG. 7 illustrates a cross-sectional view of an assembly structure if according to some embodiments of the present disclosure. The assembly structure if is similar to the assembly structure 1 shown in FIG. 1, except for a structure of the wiring structure 2f. The second dielectric layer 23 and the third dielectric layer 25 may define a cavity 20f at a process stage through machining (e.g., laser drilling or lithography process). The fourth dielectric layer 27 may cover the cavity 20f and contact the first dielectric layer 21. In addition, the thicknesses of the first circuit layer 22f and the second circuit layer 24f of FIG. 7 may be less than the thicknesses of the first circuit layer 22 and the second circuit layer 24 of FIG. 1, respectively. For example, the thicknesses of the first circuit layer 22f and the second circuit layer 24f of FIG. 7 may be 7 μm. The total thickness of the assembly structure if may be further reduced.

Figure 8:
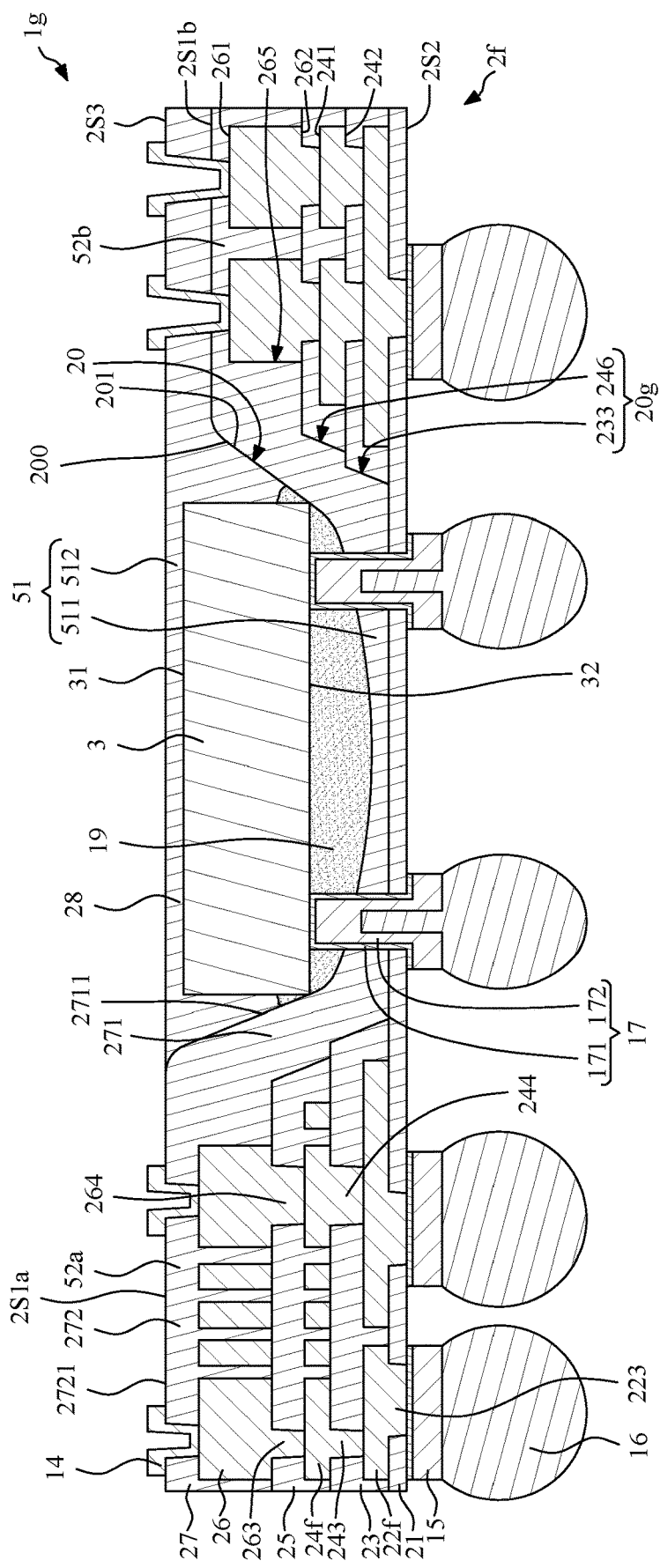
FIG. 8 illustrates a cross-sectional view of an assembly structure according to some embodiments of the present disclosure.

FIG. 8 illustrates a cross-sectional view of an assembly structure 1g according to some embodiments of the present disclosure. The assembly structure 1g is similar to the assembly structure if shown in FIG. 7, except for a structure of the wiring structure 2g. The second dielectric layer 23 may define a cavity 233 through machining (e.g., laser drilling or lithography process). The third dielectric layer 25 may define a cavity 246 through machining (e.g., laser drilling or lithography process). The size or width of the cavity 246 may be greater than the size or width of the cavity 233. The cavity 246 and the cavity 233 jointly form a cavity 20g. The fourth dielectric layer 27 may cover the cavity 20g and contact the first dielectric layer 21.

Figure 9:
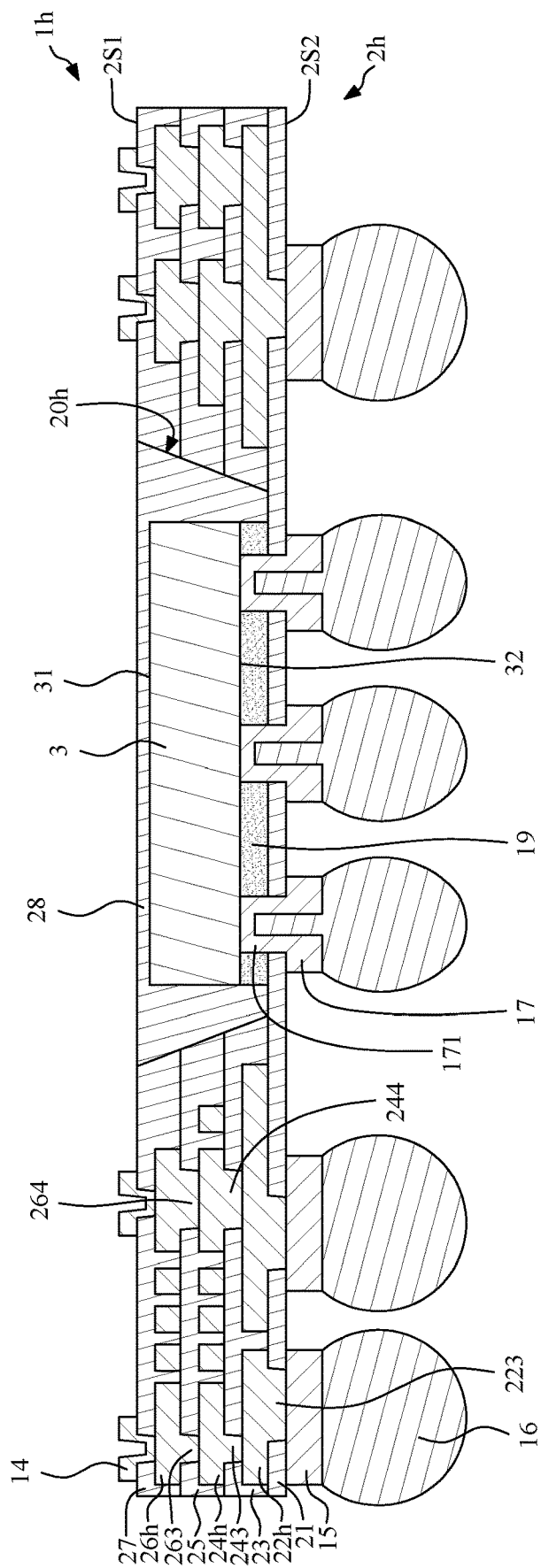
FIG. 9 illustrates a cross-sectional view of an assembly structure according to some embodiments of the present disclosure.

FIG. 9 illustrates a cross-sectional view of an assembly structure 1h according to some embodiments of the present disclosure. The assembly structure 1h is similar to the assembly structure 1 shown in FIG. 1, except for a structure of the wiring structure 2h. The second dielectric layer 23, the third dielectric layer 25 and the fourth dielectric layer 27 may define a cavity 20h at a process stage through machining (e.g., laser drilling or lithography process). The semiconductor element 3 may be disposed in the cavity 20h and attached to the first dielectric layer 21 through the buffer layer 19. In addition, the thicknesses of the first circuit layer 22h, the second circuit layer 24h and the third circuit layer 26h of FIG. 9 may be less than the thicknesses of the first circuit layer 22, the second circuit layer 24 and the third circuit layer 26 of FIG. 1, respectively. For example, the thicknesses of the first circuit layer 22h, the second circuit layer 24h and the third circuit layer 26h of FIG. 9 may be 7 μm. The total thickness of the assembly structure 1h may be further reduced.

Figure 10:
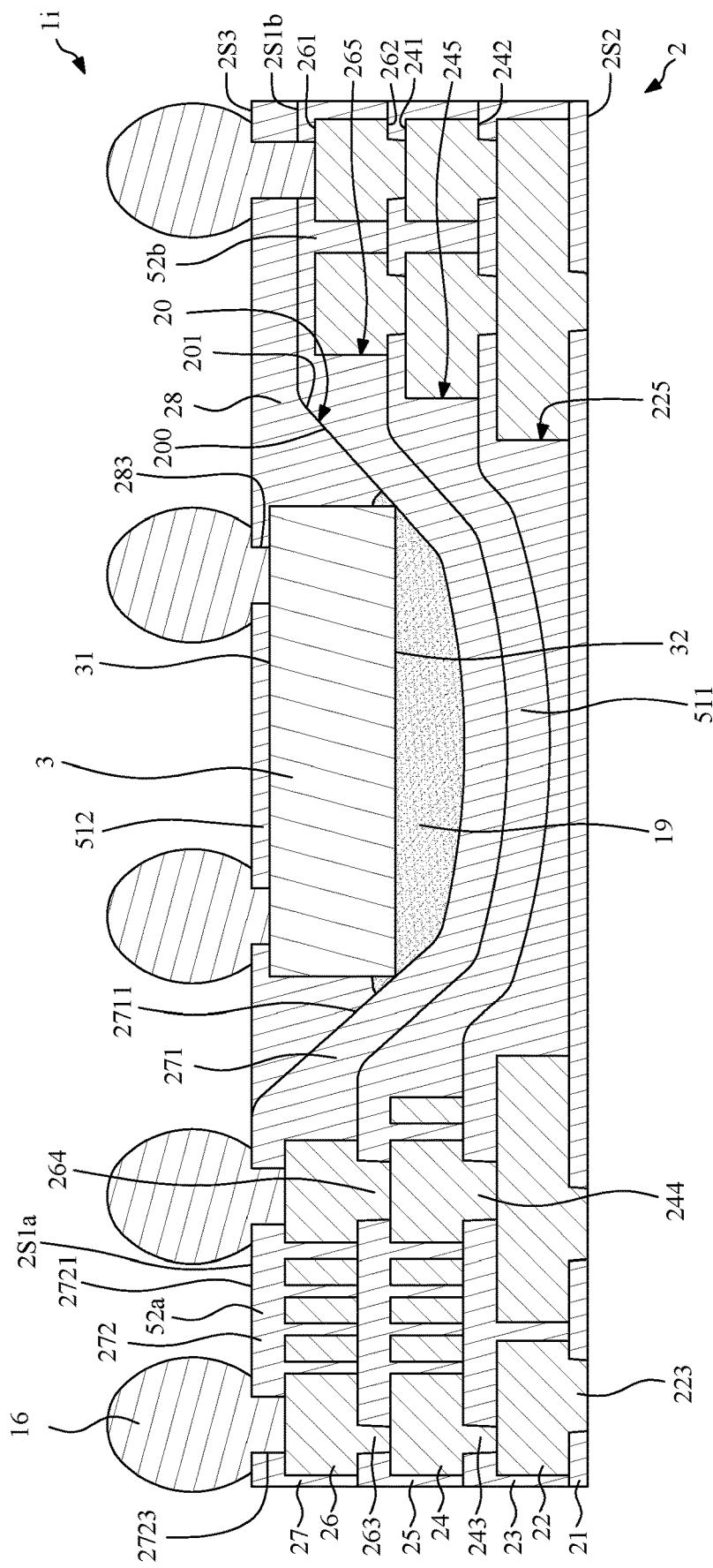
FIG. 10 illustrates a cross-sectional view of an assembly structure according to some embodiments of the present disclosure.

FIG. 10 illustrates a cross-sectional view of an assembly structure 1i according to some embodiments of the present disclosure. The assembly structure 1i is similar to the assembly structure 1 shown in FIG. 1, except that the top surface 31 of the semiconductor element 3 is an active surface. The portion of the protection material 28 on the semiconductor element 3 may define a plurality of openings 283 to expose portions of the top surface 31 of the semiconductor element 3. The second portion 272 of the fourth dielectric layer 27 (e.g., the topmost dielectric layer) may define a plurality of openings 2723 to expose portions of the third circuit layer 26. The external connectors 16 are disposed on the top surface 2S1 of the wiring structure 2, in the openings 283 to contact the top surface 31 of the semiconductor element 3, and in the openings 2723 to contact the third circuit layer 26.

Figure 11:
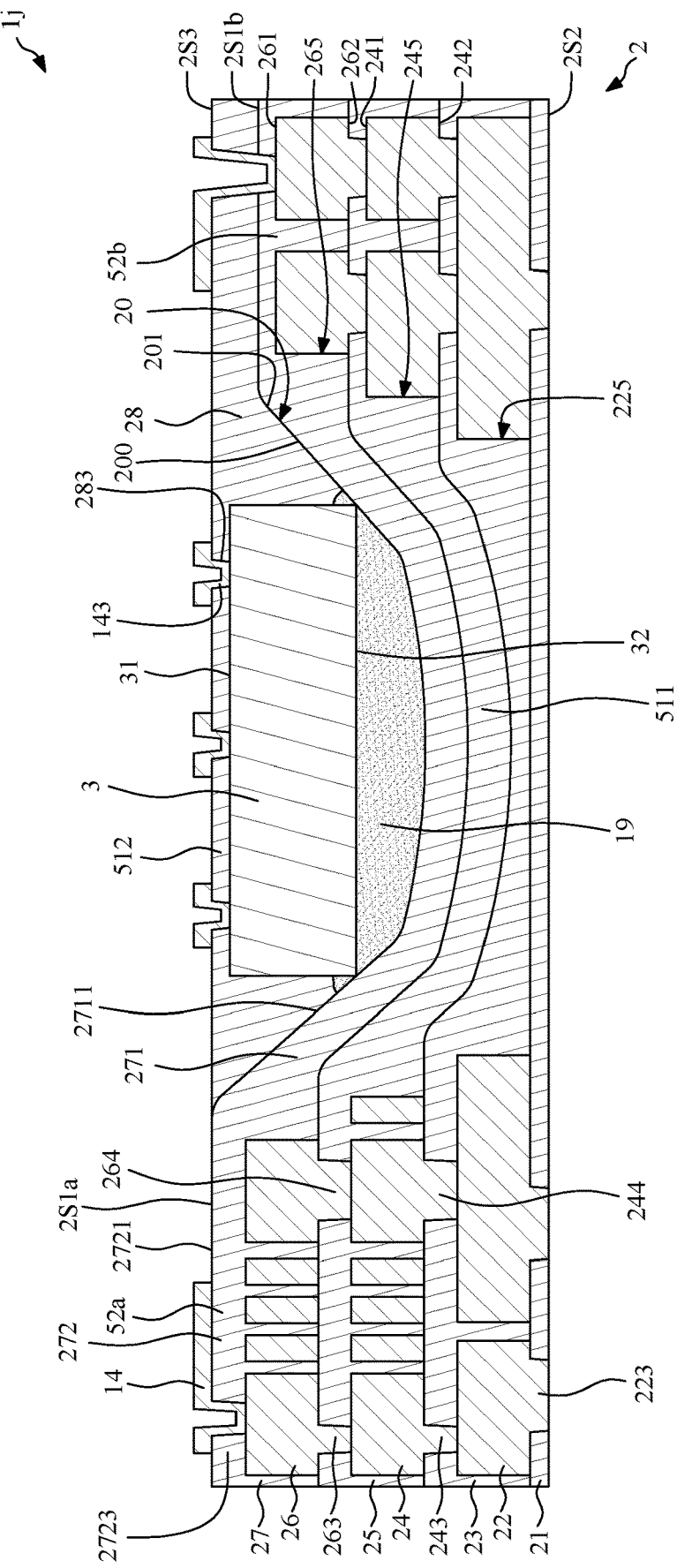
FIG. 11 illustrates a cross-sectional view of an assembly structure according to some embodiments of the present disclosure.

FIG. 11 illustrates a cross-sectional view of an assembly structure 1j according to some embodiments of the present disclosure. The assembly structure 1j is similar to the assembly structure 1i shown in FIG. 10, except that the external connectors 16 are replaced by the upper conductive structure (e.g., the redistribution layer 14). Thus, the upper conductive structure (e.g., the redistribution layer 14) is disposed on the top surface 2S1a of the first region 52a of the wiring structure 2 and on the top surface 2S3, and is electrically connected to and in contact with the top surface 31 of the semiconductor element 3 through the conductive through via 143 in the opening 283 of the protection material 28.

Figure 12:
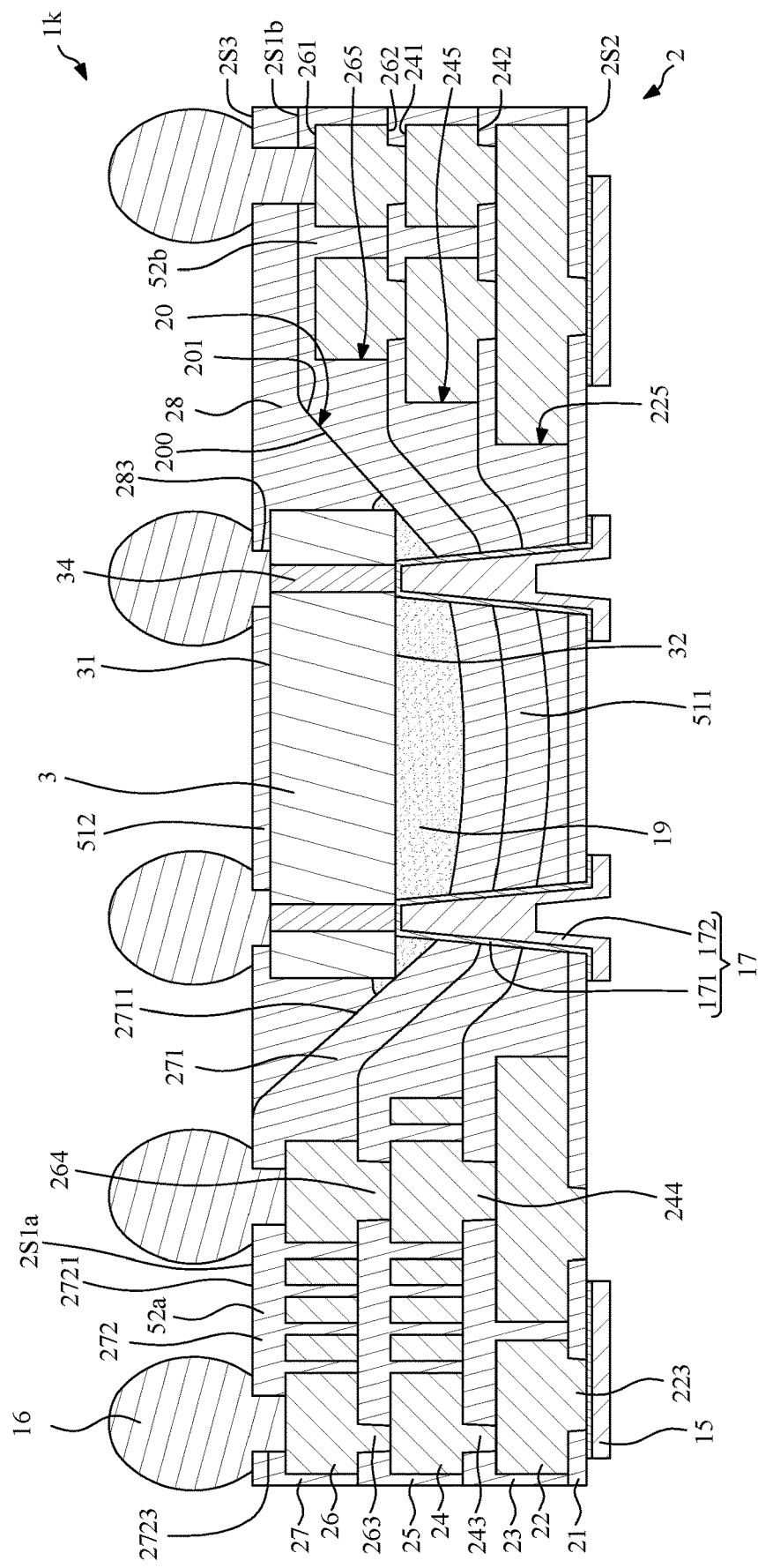
FIG. 12 illustrates a cross-sectional view of an assembly structure according to some embodiments of the present disclosure.

FIG. 12 illustrates a cross-sectional view of an assembly structure 1k according to some embodiments of the present disclosure. The assembly structure 1k is similar to the assembly structure 1i shown in FIG. 10, except that the semiconductor element 3 includes a plurality of through vias 34 extending through the semiconductor element 3. The external connector 16 may be electrically connected to the top end of the through via 34. In addition, the lower conductive structure (e.g., the redistribution layer 15) is disposed on the bottom surface 2S2 of the wiring structure 2 and is electrically connected to and in contact with the conductive via 223 of the first circuit layer 22. The lower conductive structure (e.g., the redistribution layer 15) may include a conductive through via 17 extending through the first lower portion 511 and the buffer layer 19 so as to electrically connect and contact the bottom end of the through via 34 of the semiconductor element 3. The conductive through via 17 tapers toward the semiconductor element 3.

Figure 13:
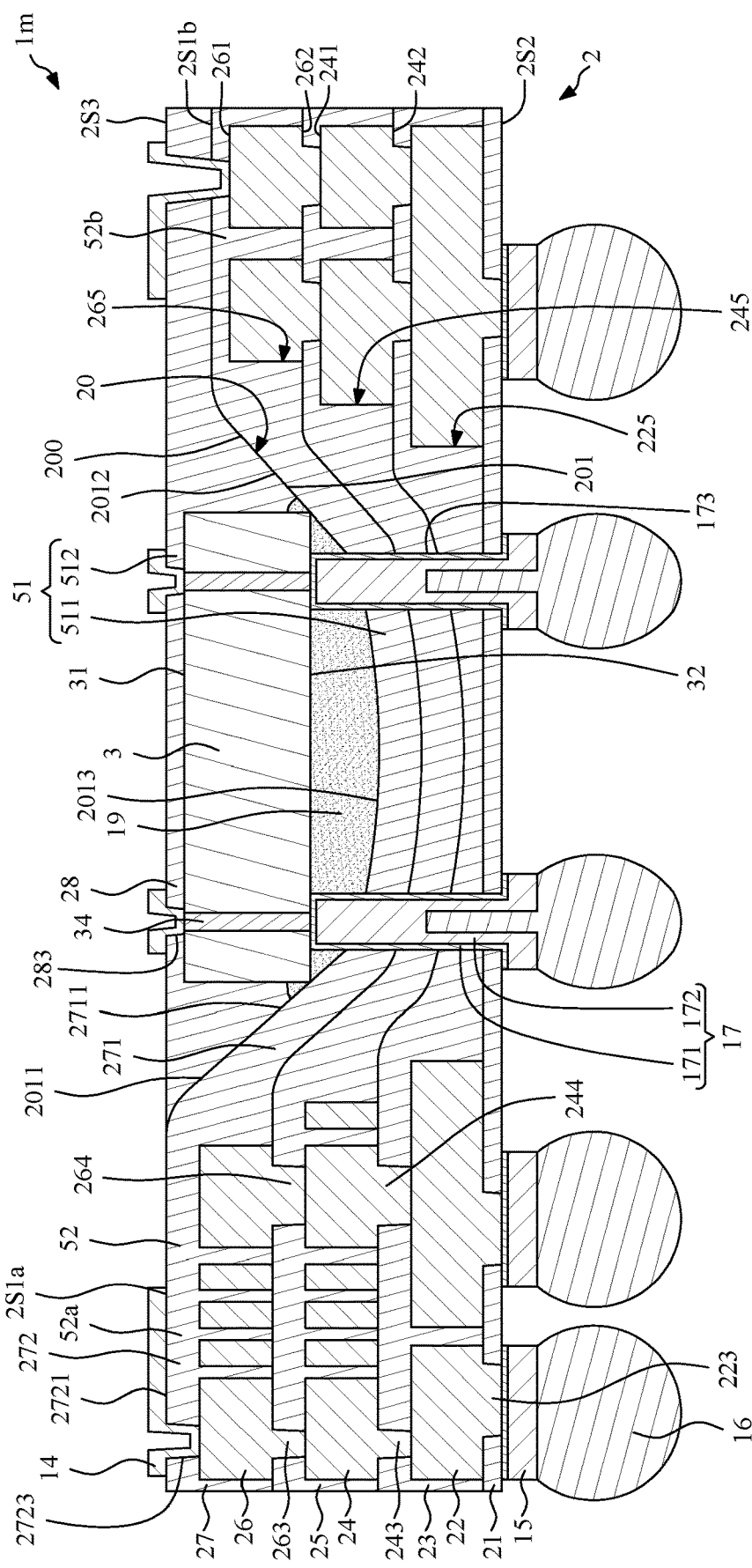
FIG. 13 illustrates a cross-sectional view of an assembly structure according to some embodiments of the present disclosure.

FIG. 13 illustrates a cross-sectional view of an assembly structure 1m according to some embodiments of the present disclosure. The assembly structure 1m is similar to the assembly structure 1k shown in FIG. 12, except that the external connectors 16 on the top surface 2S1a of the first region 52a of the wiring structure 2 and on the top surface 2S3 are replaced by the upper conductive structure (e.g., the redistribution layer 14). In addition, the external connectors 16 are bonded to and connected to the lower conductive structure (e.g., the redistribution layer 15) including the conductive through via 17.

Figure 14:
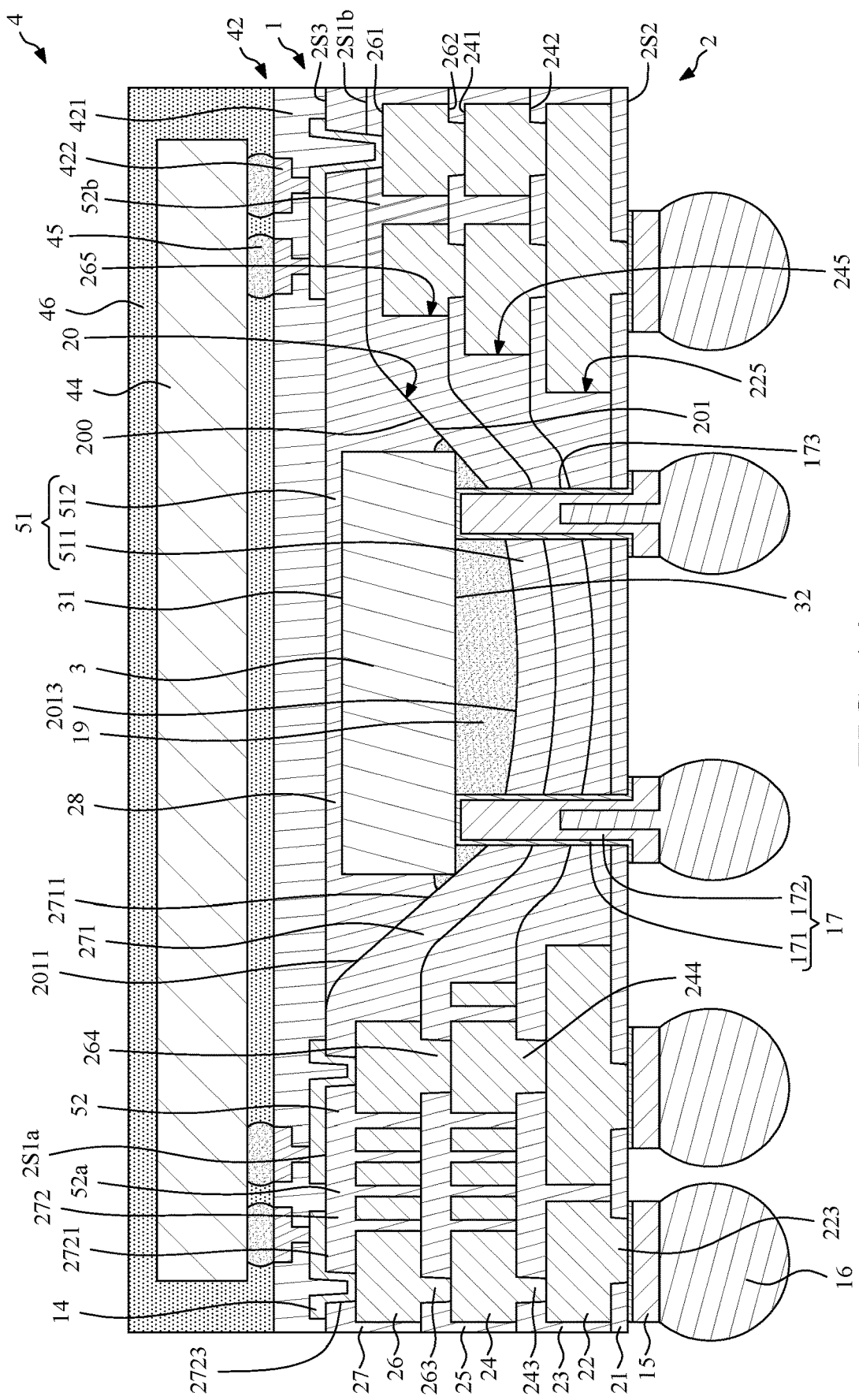
FIG. 14 illustrates a cross-sectional view of a package structure according to some embodiments of the present disclosure.

FIG. 14 illustrates a cross-sectional view of a package structure 4 according to some embodiments of the present disclosure. The package structure 4 may include a wiring structure 2, a semiconductor element 3, a protection material 28, a redistribution structure 42, an electronic device 44 and an encapsulant 46. The wiring structure 2, the semiconductor element 3 and the protection material 28 of FIG. 14 may be similar to the wiring structure 2, the semiconductor element 3 and the protection material 28 of FIG. 1, respectively. The redistribution structure 42 may be electrically connected to the circuit layers 22, 24, 26 of the wiring structure 2. In some embodiments, the redistribution structure 42 may include the redistribution layer 14, a dielectric layer 421 covering the redistribution layer 14 and a conductive layer 422 disposed on or embedded in the dielectric layer 421 and electrically connected to the redistribution layer 14. The electronic device 44 (e.g., a memory die) may be electrically connected to the conductive layer 422 of the redistribution structure 42 through a plurality of solder materials 45. The encapsulant 46 (e.g. molding compound) may cover and/or encapsulate the electronic device 44 and the redistribution structure 42.

FIG. 15 through FIG. 31 illustrate a method for manufacturing an assembly structure according to some embodiments of the present disclosure. In some embodiments, the method is for manufacturing an assembly structure 1 shown in FIG. 1.

Figure 15:
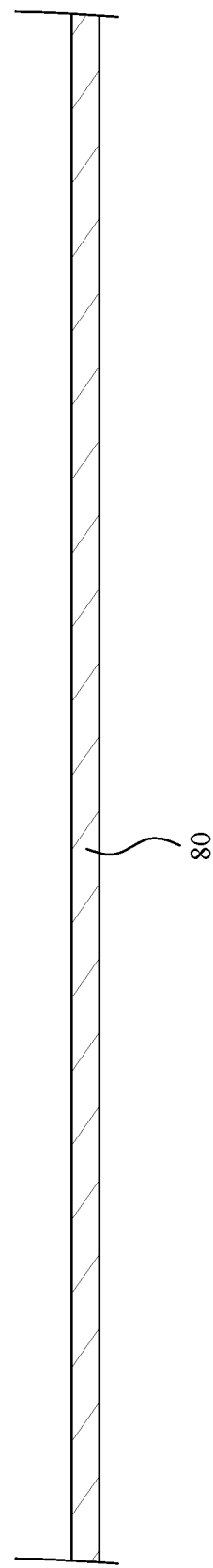
FIG. 15 illustrates one or more stages of an example of a method for manufacturing an assembly structure according to some embodiments of the present disclosure.

Referring to FIG. 15, a carrier 80 is provided. The carrier 80 may be a glass carrier, and may be in a wafer type, a panel type or a strip type.

Figure 16:
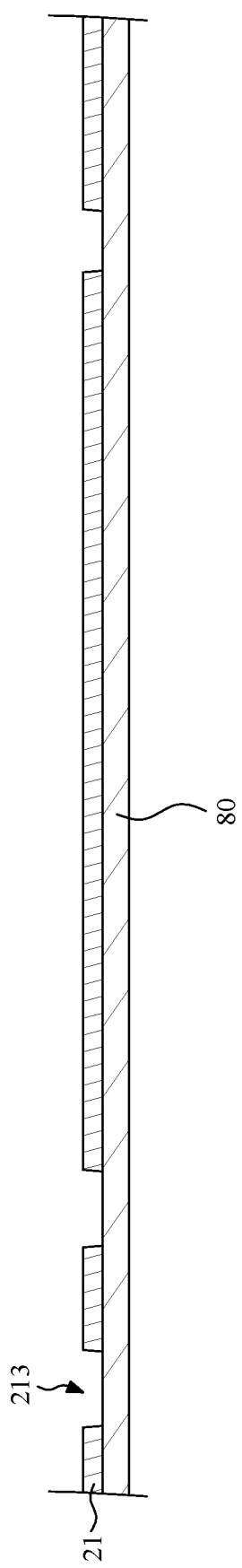
FIG. 16 illustrates one or more stages of an example of a method for manufacturing an assembly structure according to some embodiments of the present disclosure.

Referring to FIG. 16, a first dielectric layer 21 (e.g., a bottommost dielectric layer) is formed or disposed on the carrier 80. Then, the first dielectric layer 21 may define at least one through hole 213 to expose a portion of the carrier 80. The through hole 213 may be formed by mechanical drilling, laser drilling, or lithographic techniques.

Figure 17:
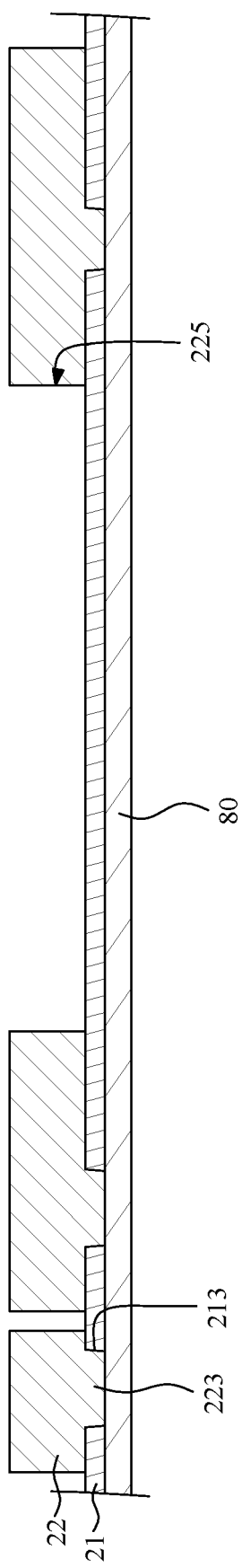
FIG. 17 illustrates one or more stages of an example of a method for manufacturing an assembly structure according to some embodiments of the present disclosure.

Referring to FIG. 17, a first circuit layer 22 (e.g., a bottommost circuit layer) is formed or disposed on the first dielectric layer 21 by, for example, plating. The first circuit layer 22 includes at least one conductive via 223 extending in the through hole 213 of the first dielectric layer 21 to form an external contact. The first circuit layer 22 may be a patterned redistribution layer, and may define a gap 225. A width of the gap 225 of the first circuit layer 22 may be greater than a width of the semiconductor element 3 of FIG. 1.

Figure 18:
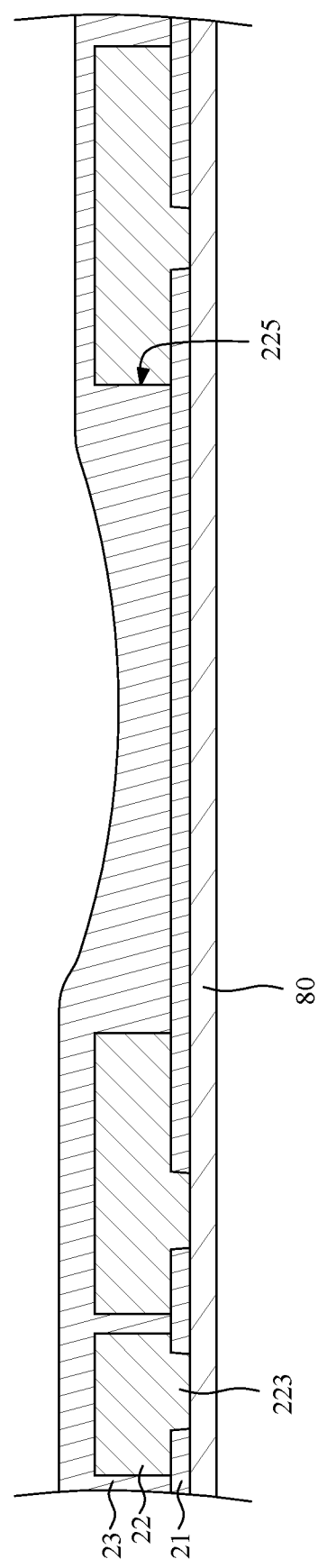
FIG. 18 illustrates one or more stages of an example of a method for manufacturing an assembly structure according to some embodiments of the present disclosure.

Referring to FIG. 18, a second dielectric layer 23 is formed or disposed on the first dielectric layer 21 to cover the first circuit layer 22. The second dielectric layer 23 may be conformal to the first circuit layer 22. For example, the second dielectric layer 23 may be applied in a liquid form by coating, or in a dry film form by laminating. The second dielectric layer 23 may be applied in a constant volume over the entire first dielectric layer 21 to cover the first circuit layer 22. Hence, the "topography" of the second dielectric layer 23 may be affected by the first circuit layer 22 disposed thereunder. That is, the "topography" of the second dielectric layer 23 may be descending at a position where the first circuit layer 22 is absent (i.e., the position of the gap 225). Accordingly, a top surface of the second dielectric layer 23 may not be flat or planar. The second dielectric layer 23 may define a recess portion corresponding to the gap 225 of the first circuit layer 22. In some embodiments, a density of the left portion of the first circuit layer 22 may be greater than a density of the right portion of the first circuit layer 22. Thus, the top surface of the second dielectric layer 23 on the left portion of the first circuit layer 22 may be higher than the top surface of the second dielectric layer 23 on the right portion of the first circuit layer 22.

Figure 19:
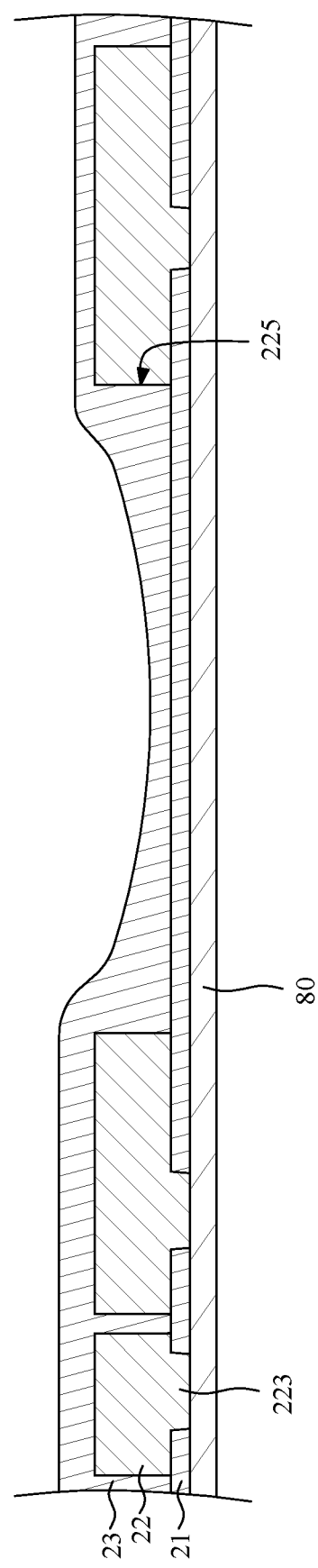
FIG. 19 illustrates one or more stages of an example of a method for manufacturing an assembly structure according to some embodiments of the present disclosure.

Referring to FIG. 19, a curing process is conducted. Thus, the second dielectric layer 23 may shrink, and the recess portion may become deeper.

Figure 20:
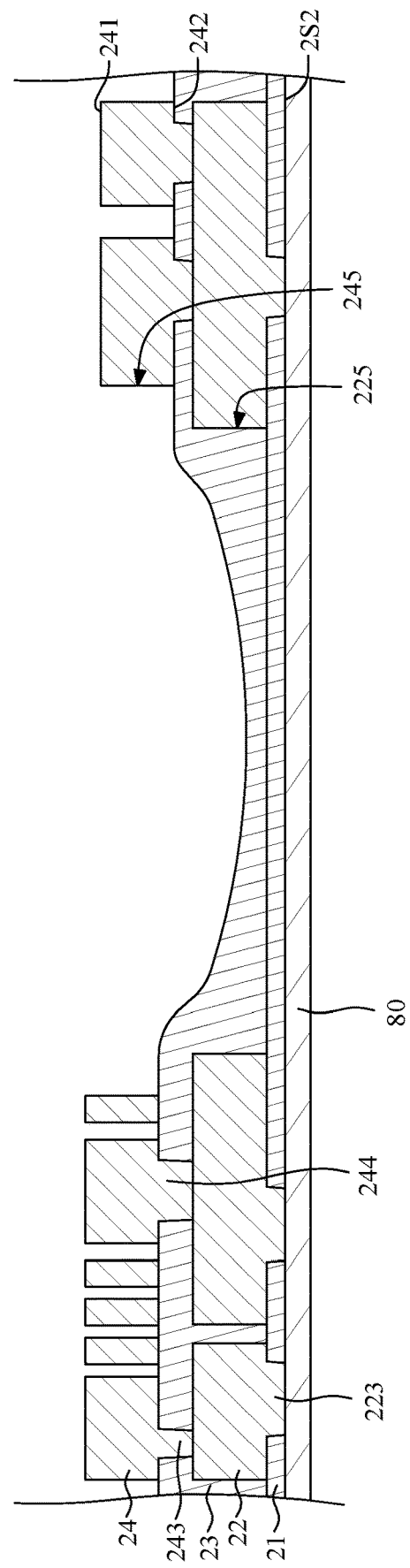
FIG. 20 illustrates one or more stages of an example of a method for manufacturing an assembly structure according to some embodiments of the present disclosure.

Referring to FIG. 20, a second circuit layer 24 is formed or disposed on the second dielectric layer 23 by, for example, plating. The second circuit layer 24 may include a first conductive via 243 and a second conductive via 244 extending through the second dielectric layer 23 to contact and electrically connect the first circuit layer 22. The second circuit layer 24 may be a patterned redistribution layer, and may define a gap 245 corresponding to the gap 225 of the first circuit layer 22. A width of the gap 245 of the second circuit layer 24 may be greater than the width of the semiconductor element 3 of FIG. 1. Further, the width of the gap 245 of the second circuit layer 24 may be greater than the width of the gap 225 of the first circuit layer 22. The second circuit layer 24 may have a top surface 241 and a bottom surface 242.

Figure 21:
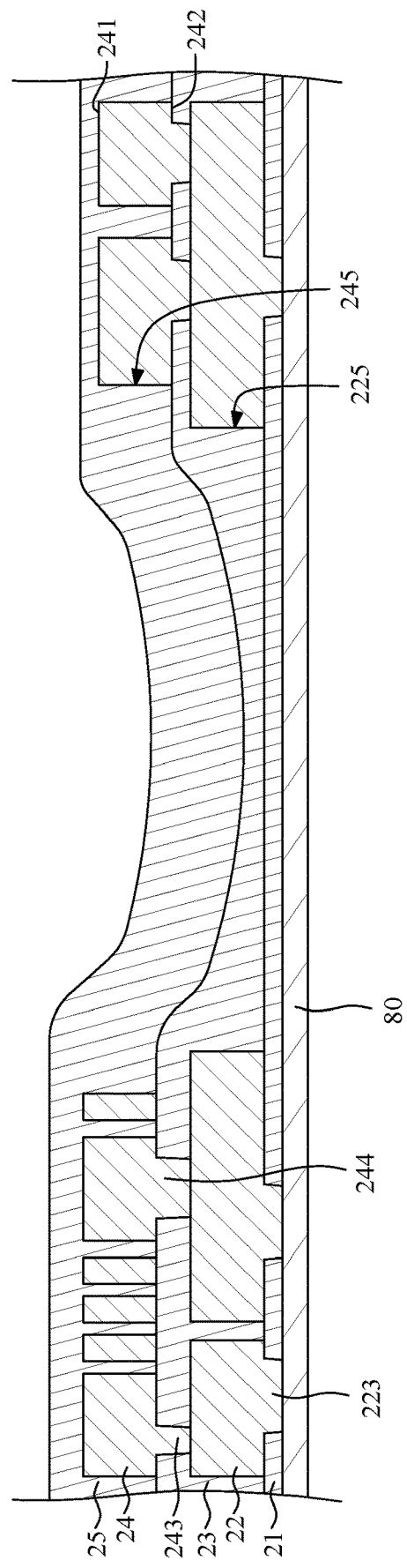
FIG. 21 illustrates one or more stages of an example of a method for manufacturing an assembly structure according to some embodiments of the present disclosure.

Referring to FIG. 21, a third dielectric layer 25 is formed or disposed on the second dielectric layer 23 to cover the second circuit layer 24. The third dielectric layer 25 may be conformal to the second circuit layer 24 and the second dielectric layer 23. For example, the third dielectric layer 25 may be applied in a liquid form by coating, or in a dry film form by laminating. Hence, the "topography" of the third dielectric layer 25 may be affected by the second circuit layer 24 disposed thereunder. That is, the "topography" of the third dielectric layer 25 may be descending at a position where the second circuit layer 24 is absent (i.e., the position of the gap 245). Accordingly, a top surface of the third dielectric layer 25 may not be flat or planar. The third dielectric layer 25 may define a recess portion corresponding to the gap 245 of the second circuit layer 24 and the recess portion of the second dielectric layer 23. In some embodiments, a density of the left portion of the second circuit layer 24 may be greater than a density of the right portion of the second circuit layer 24. Thus, the top surface of the third dielectric layer 25 on the left portion of the second circuit layer 24 may be higher than the top surface of the third dielectric layer 25 on the right portion of the second circuit layer 24.

Figure 22:
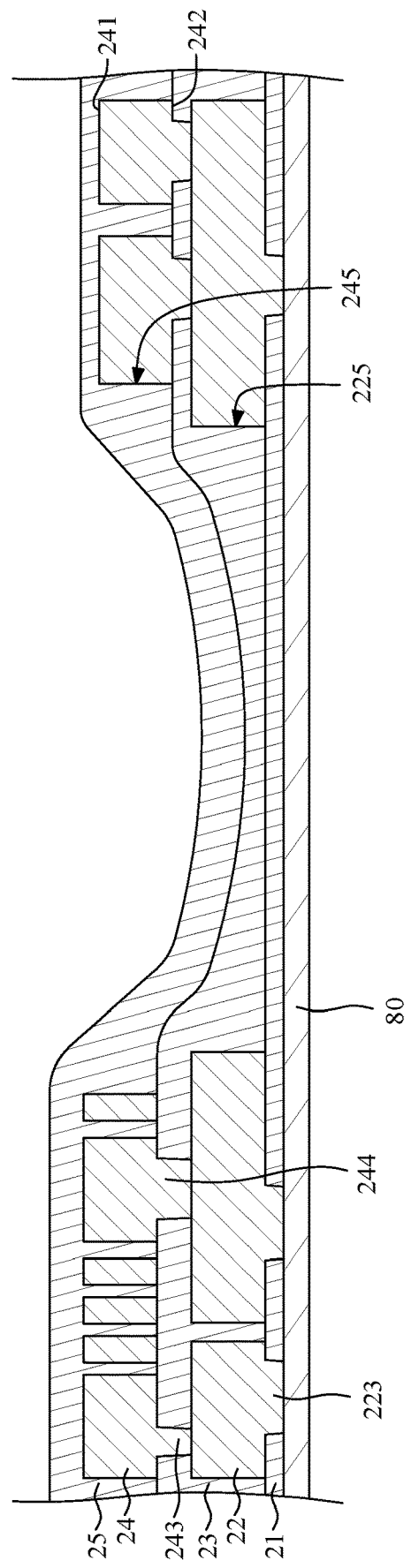
FIG. 22 illustrates one or more stages of an example of a method for manufacturing an assembly structure according to some embodiments of the present disclosure.

Referring to FIG. 22, a curing process is conducted. Thus, the third dielectric layer 25 may shrink, and the recess portion of the third dielectric layer 25 may become deeper.

Figure 23:
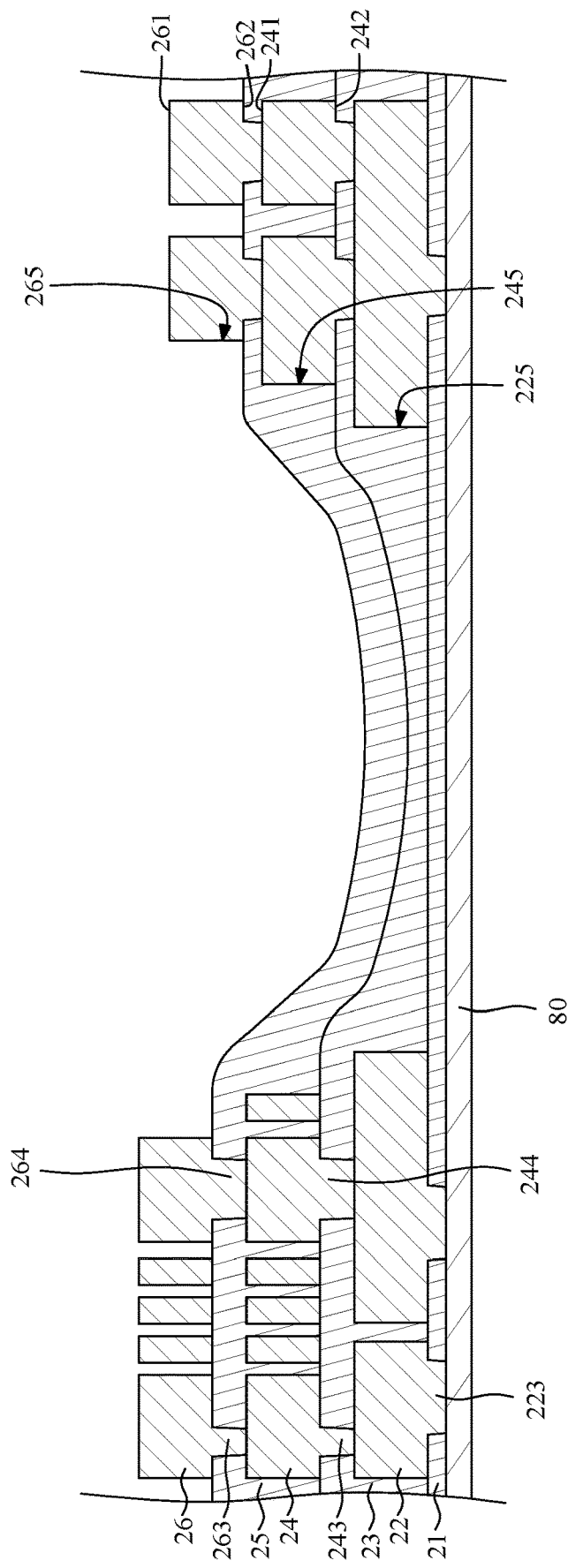
FIG. 23 illustrates one or more stages of an example of a method for manufacturing an assembly structure according to some embodiments of the present disclosure.

Referring to FIG. 23, a third circuit layer 26 (e.g., a topmost circuit layer) is formed or disposed on the third dielectric layer 25 by, for example, plating. The third circuit layer 26 may include a first conductive via 263 and a second conductive via 264 extending through the third dielectric layer 25 to contact and electrically connect the second circuit layer 24. The third circuit layer 26 may be a patterned redistribution layer, and may define a gap 265 corresponding to the gap 245 of the second circuit layer 24. A width of the gap 265 of the third circuit layer 26 may be greater than the width of the semiconductor element 3 of FIG. 1. Further, the width of the gap 265 of the third circuit layer 26 may be greater than the width of the gap 245 of the second circuit layer 24. The third circuit layer 26 may have a top surface 261 and a bottom surface 262.

Figure 24:
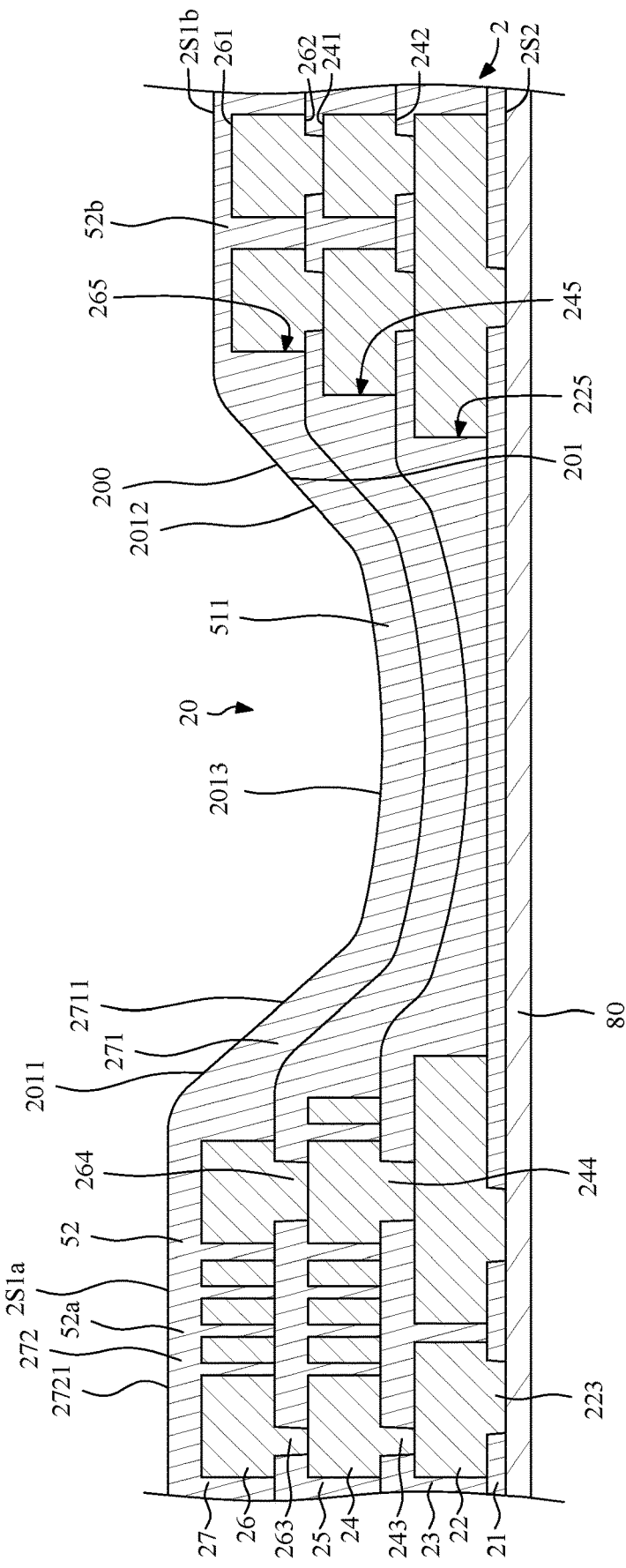
FIG. 24 illustrates one or more stages of an example of a method for manufacturing an assembly structure according to some embodiments of the present disclosure.

Referring to FIG. 24, a fourth dielectric layer 27 (e.g., a topmost dielectric layer) is formed or disposed on the third dielectric layer 25 to cover the third circuit layer 26. The fourth dielectric layer 27 may be conformal to the third circuit layer 26 and the third dielectric layer 25. Hence, the "topography" of the fourth dielectric layer 27 may be descending at a position where the third circuit layer 26 is absent (i.e., the position of the gap 265). Accordingly, a top surface of the fourth dielectric layer 27 may not be flat or planar. The fourth dielectric layer 27 may define a recess portion corresponding to the gap 265 of the third circuit layer 26 and the recess portion of the third dielectric layer 25. Then, a curing process is conducted. Thus, the fourth dielectric layer 27 may shrink, and the recess portion of the fourth dielectric layer 27 may become deeper and may form an accommodating recess 20. In some embodiments, a first portion 271 of the fourth dielectric layer 27 may be recessed from a second portion 272 of the fourth dielectric layer 27 so as to define the accommodating recess 20. The entire accommodating recess 20 may be defined only by the fourth dielectric layer 27. The accommodating recess 20 and the cured fourth dielectric layer 27 are formed concurrently. The accommodating recess 20 is formed by continuous deformation or shrinkage of the fourth dielectric layer 27 (e.g., the topmost dielectric layer). The accommodating recess 20 may be not formed by machining.

Meanwhile, a wiring structure 2 is obtained and provided. The wiring structure 2 may include a first lower portion 511 of a first portion 51 and a second portion 52 surrounding the first portion 51. The first lower portion 511 may be a die attach portion, and the second portion 52 may be a circuit portion adjacent to the die attach portion. The conductive-trace density of the circuit layer in the die attach portion (i.e., the first lower portion 511) is less than a conductive-trace density of the circuit layer in the circuit portion (i.e., the second portion 52). There may be no conductive trace of the circuit layer formed in the die attach portion.

The wiring structure 2 may have a top surface 2S1a, 2S1b and a bottom surface 2S2 opposite to the top surface 2S1a, 2S1b. Since the fourth dielectric layer 27 may shrink naturally after a curing process, a surface 201 of the accommodating recess 20 and the top surface 2S1a, 2S1b of the wiring structure 2 are smooth and continuous. Thus, the accommodating recess 20 may be unrecognizable from a top view. In addition, the top surface of the first lower portion 511 of the first portion 51 is the surface 201 of the accommodating recess 20 that may include a first slanted surface 2011, a second slanted surface 2012 opposite to the first slanted surface 2011 and a receiving surface 2013 extending between the first slanted surface 2011 and the second slanted surface 2012.

In some embodiments, a fiducial mark 29 (FIG. 5) may be formed on the die attach portion or in the accommodating recess 20. The fiducial mark 29 may be an opening formed on the fourth dielectric layer 27. Thus, the accommodating recess 20 may be recognizable from a top view.

Figure 25:
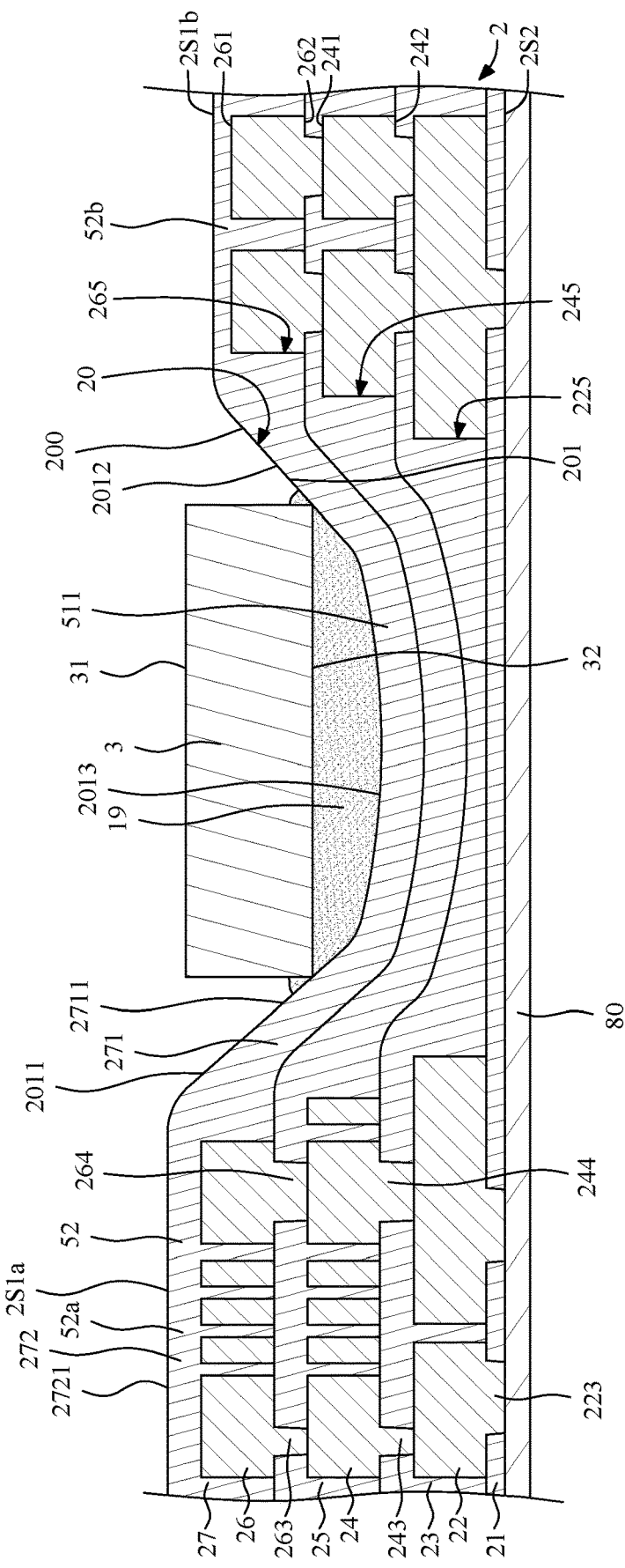
FIG. 25 illustrates one or more stages of an example of a method for manufacturing an assembly structure according to some embodiments of the present disclosure.

Referring to FIG. 25, a semiconductor element 3 (e.g., a semiconductor die or a semiconductor chip) is disposed on the die attach portion or in the accommodating recess 20. The semiconductor element 3 may have a top surface 31 and a bottom surface 32 opposite to the top surface 31. The bottom surface 32 of the semiconductor element 3 may be disposed on or attached to the receiving surface 2013 of the accommodating recess 20 through a buffer layer 19. The bottom surface 32 of the semiconductor element 3 may be an active surface.

Figure 26:
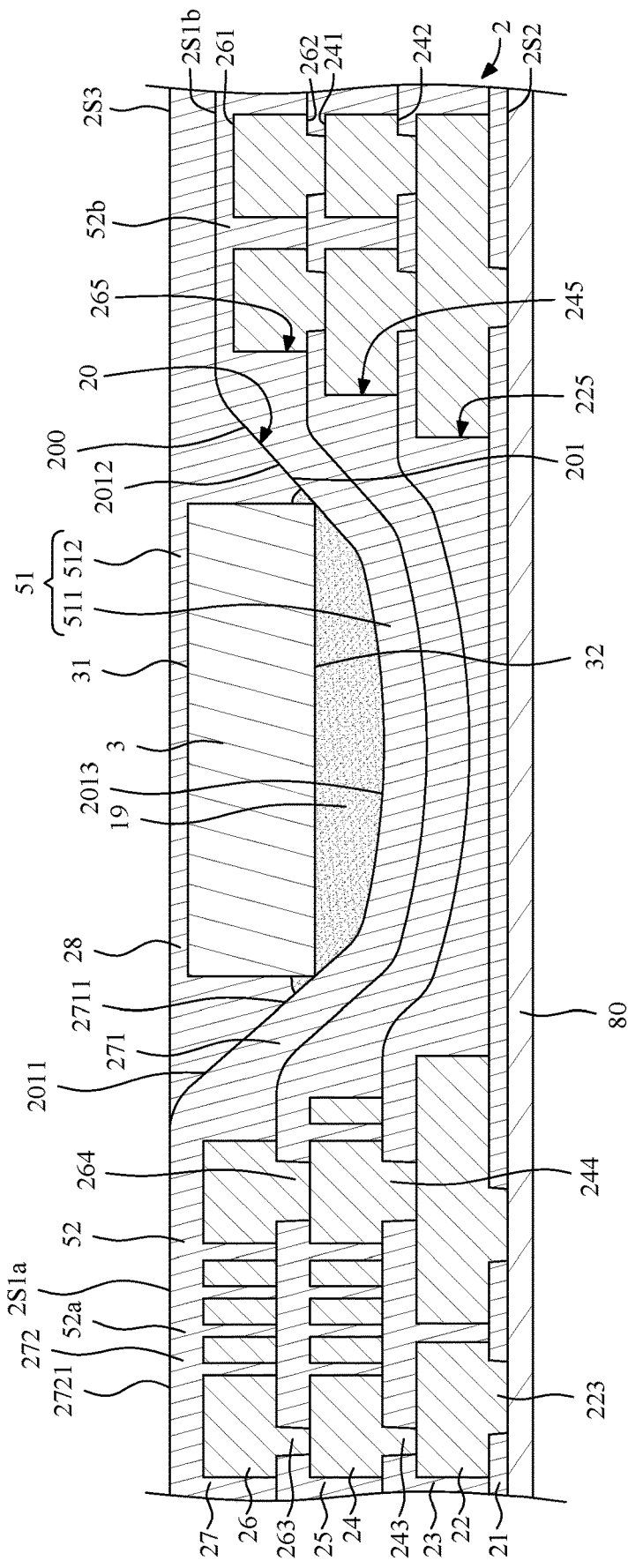
FIG. 26 illustrates one or more stages of an example of a method for manufacturing an assembly structure according to some embodiments of the present disclosure.

Referring to FIG. 26, a protection material 28 is formed or disposed in the accommodating recess 20 to cover and encapsulate the semiconductor element 3 and the buffer layer 19. A portion of the protection material 28 on the semiconductor element 3 is a first upper portion 512. An extending portion 284 of the protection material 28 may extend to cove the top surface 2s1b of the second region 52b to form a top surface 2S3.

Figure 27:
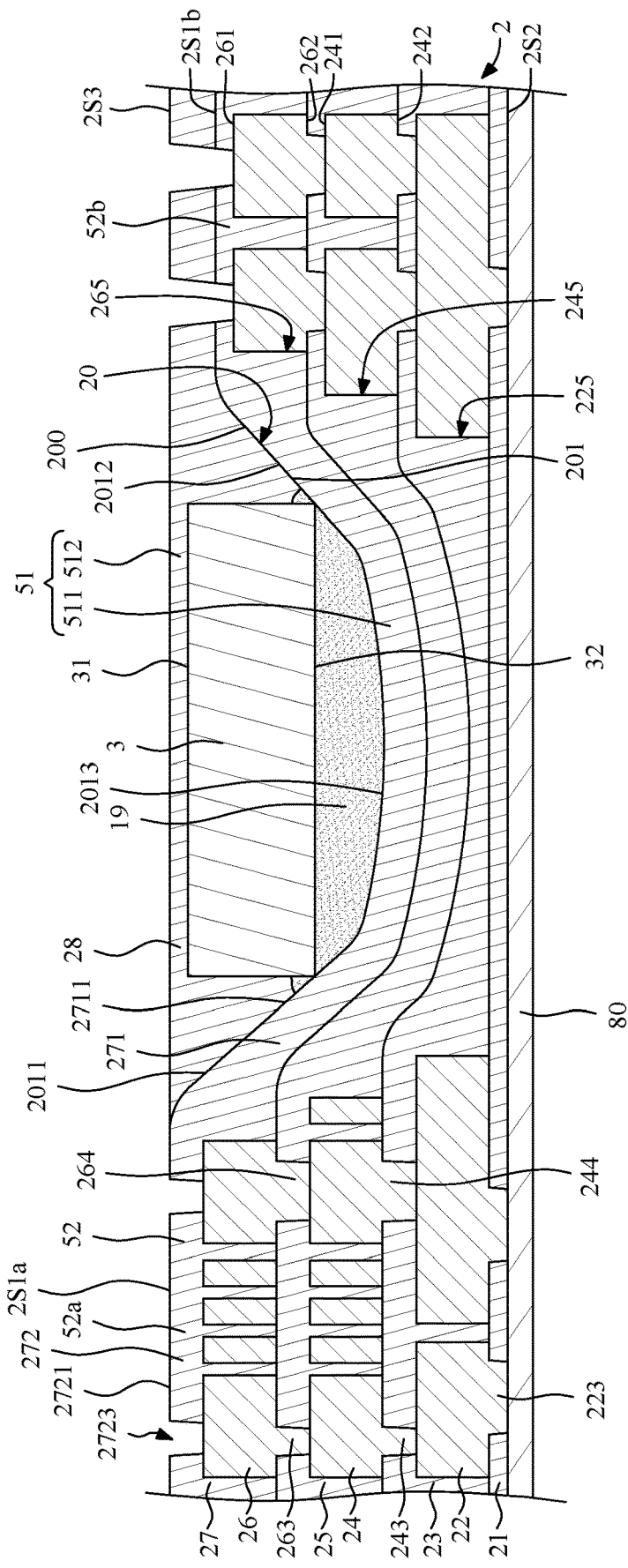
FIG. 27 illustrates one or more stages of an example of a method for manufacturing an assembly structure according to some embodiments of the present disclosure.

Referring to FIG. 27, a plurality of openings 2723 are formed on the second portion 272 of the fourth dielectric layer 27 and on the protection material 28 so as to expose portions of the third circuit layer 26 (e.g., the topmost circuit layer).

Figure 28:
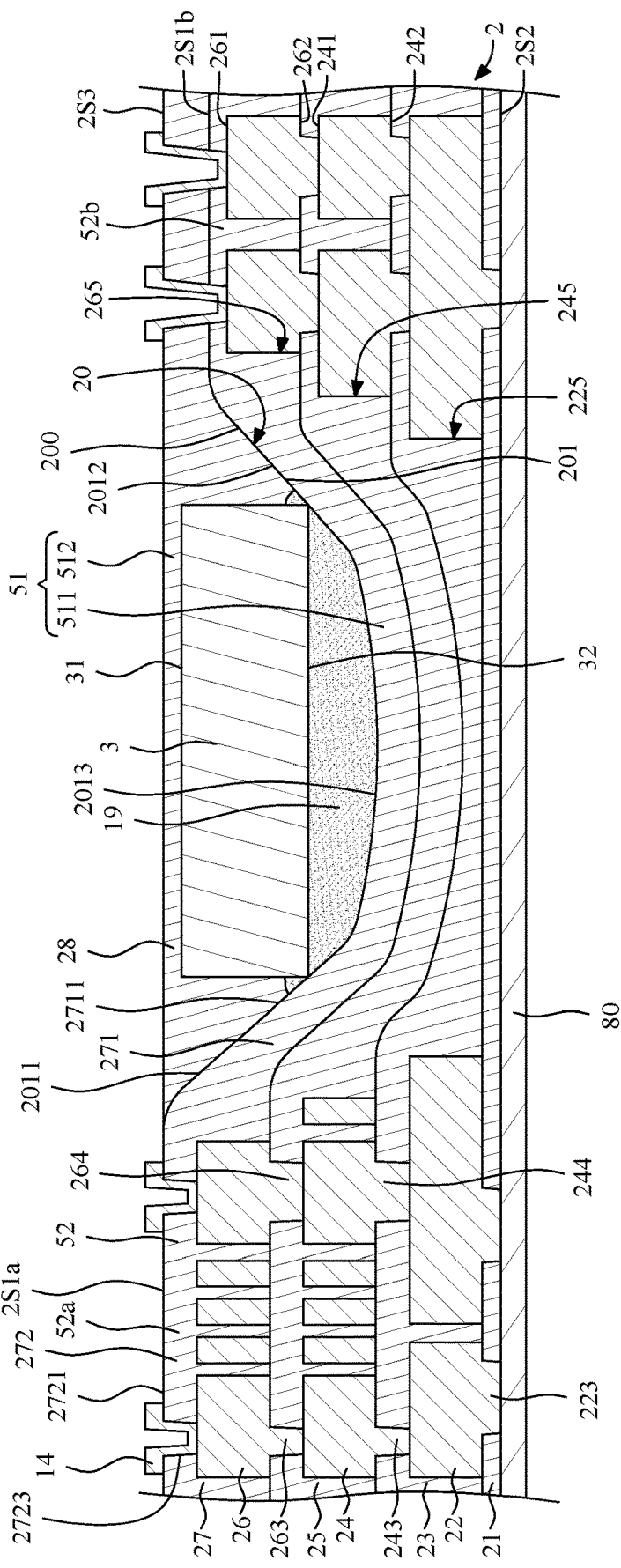
FIG. 28 illustrates one or more stages of an example of a method for manufacturing an assembly structure according to some embodiments of the present disclosure.

Referring to FIG. 28, an upper conductive structure (e.g., a redistribution layer 14) is formed or disposed on the top surface 2S1a of the wiring structure 2, the top surface 2S3 and in the opening 2723 of the fourth dielectric layer 27 to electrically connect and contact the third circuit layer 26.

Figure 29:
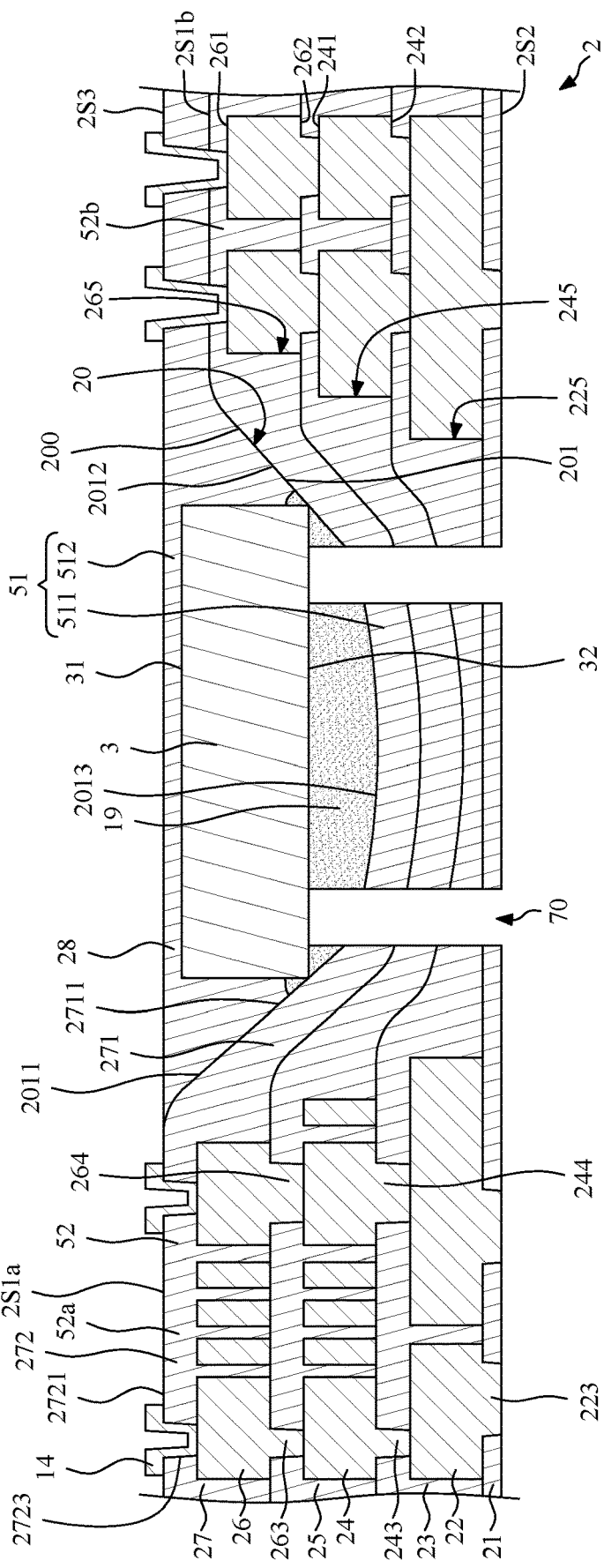
FIG. 29 illustrates one or more stages of an example of a method for manufacturing an assembly structure according to some embodiments of the present disclosure.

Referring to FIG. 29, the carrier 80 is removed. Then, a plurality of through holes 70 are formed in the first lower portion 511 of the first portion 51 to extend through the first lower portion 511 (including the first dielectric layer 21, the second dielectric layer 23, the third dielectric layer 25 and the fourth dielectric layer 27) and the buffer layer 19 to expose portions of the bottom surface 32 of the semiconductor element 3.

Figure 30:
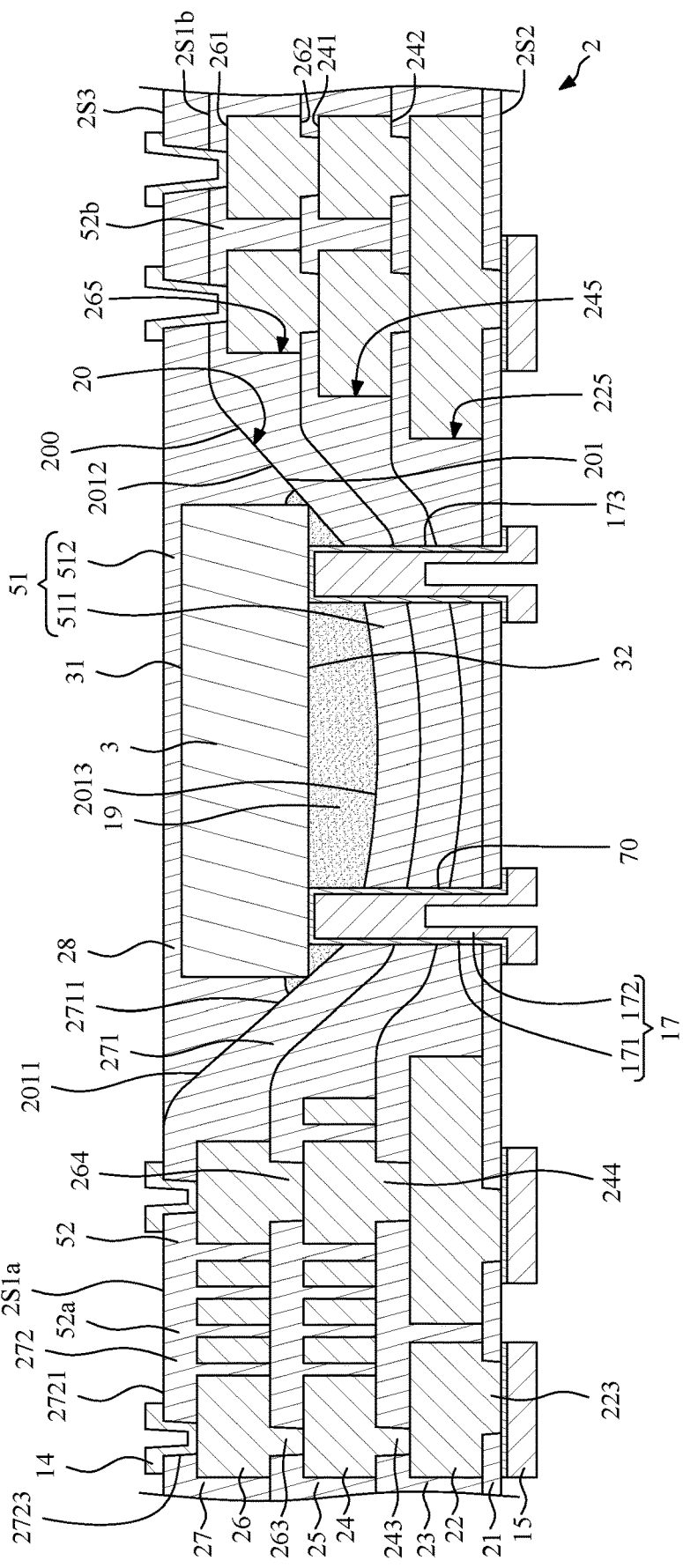
FIG. 30 illustrates a cross-sectional view of an assembly structure according to some embodiments of the present disclosure.

Referring to FIG. 30, a lower conductive structure (e.g., a redistribution layer 15) is formed or disposed on the bottom surface 2S2 of the wiring structure 2 and is electrically connected to and in contact with the conductive via 223 of the first circuit layer 22. The lower conductive structure (e.g., the redistribution layer 15) may include a conductive through via 17 disposed in the through holes 70 to electrically connect and contact the bottom surface 32 of the semiconductor element 3.

Figure 31:
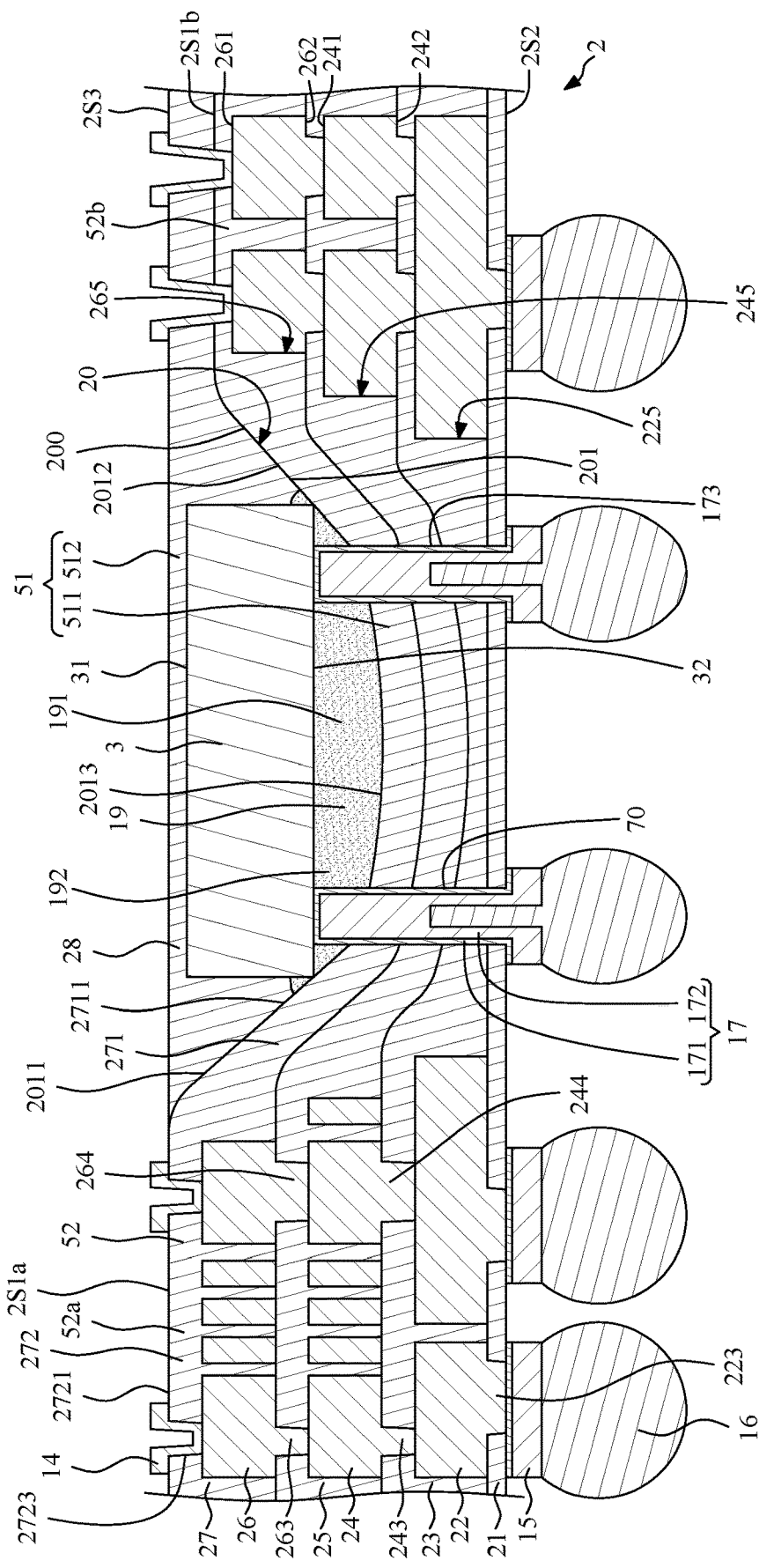
FIG. 31 illustrates a cross-sectional view of an assembly structure according to some embodiments of the present disclosure.

Referring to FIG. 31, at least one external connector 16 (e.g., solder material) is formed or disposed on the lower conductive structure (e.g., the redistribution layer 15).

Then, a singulation process may be conducted to the wiring structure 2 so as to obtain the assembly structure 1 as shown in FIG. 1.

Figure 32:
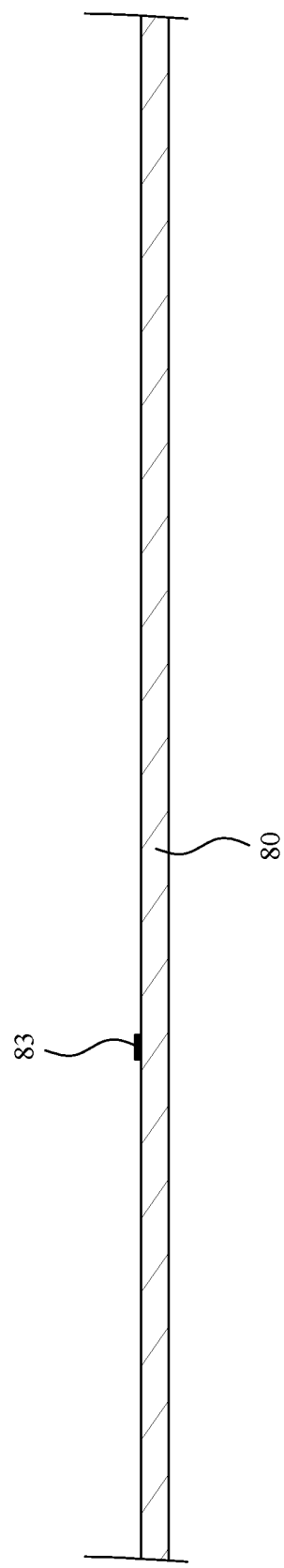
FIG. 32 illustrates a cross-sectional view of an assembly structure according to some embodiments of the present disclosure.
Figure 33:
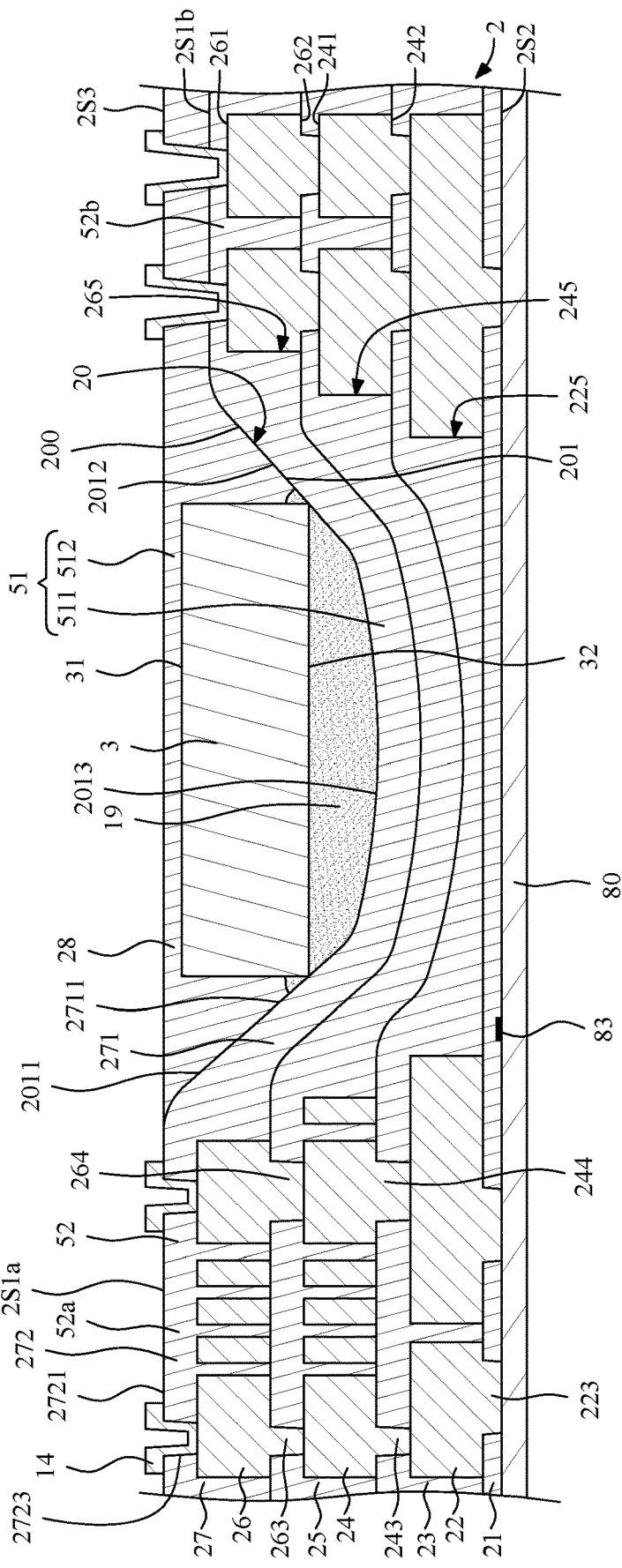
FIG. 33 illustrates a cross-sectional view of an assembly structure according to some embodiments of the present disclosure.

FIG. 32 through FIG. 33 illustrates a method for manufacturing an assembly structure according to some embodiments of the present disclosure, such as the assembly structure 1 shown in FIG. 1.

Referring to FIG. 32, a carrier 80 is provided. The carrier 80 may be a glass carrier, and may be in a wafer type, a panel type or a strip type. Then, a fiducial mark 83 is formed on the carrier 80.

Then, the following stages of the method may be similar to the stages illustrated in FIG. 16 to FIG. 28 so as to form the structure of FIG. 33.

Then, the following stages of the method may be similar to the stages illustrated in FIG. 29 to FIG. 31 so as to obtain the assembly structure 1 as shown in FIG. 1.

Figure 34:
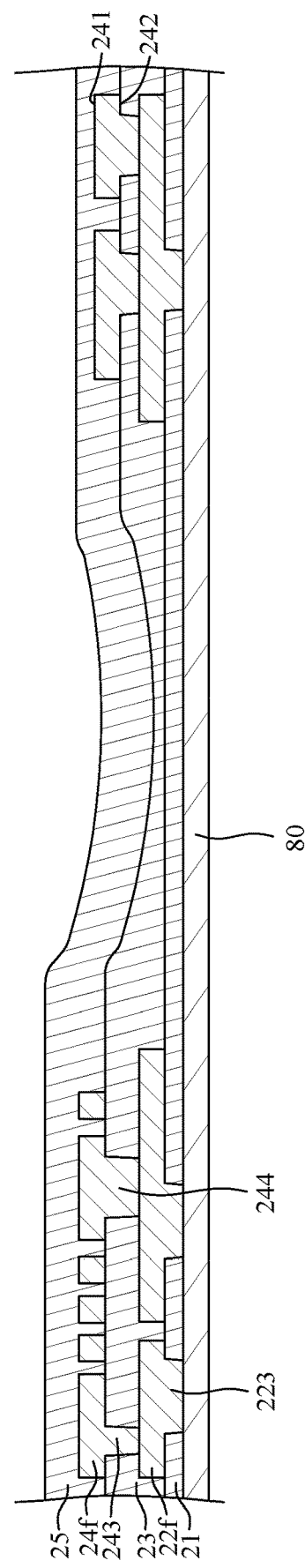
FIG. 34 illustrates a cross-sectional view of a package structure according to some embodiments of the present disclosure.

FIG. 34 through FIG. 37 illustrates a method for manufacturing an assembly structure according to some embodiments of the present disclosure, such as the assembly structure if shown in FIG. 7. The initial stages of the illustrated process are similar to the stages illustrated in FIG. 15 to FIG. 22 except for the thicknesses of the first circuit layer 22f and the second circuit layer 24f. FIG. 34 depicts a stage similar to the stage depicted in FIG. 26. It is noted that the thicknesses of the first circuit layer 22f and the second circuit layer 24f are less than the thicknesses of the first circuit layer 22 and the second circuit layer 24 respectively.

Figure 35:
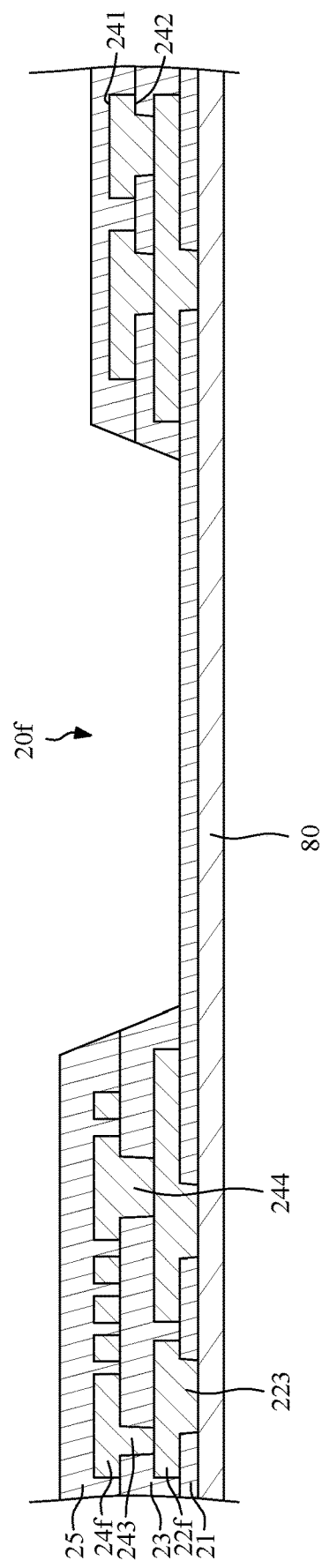
FIG. 35 illustrates one or more stages of an example of a method for manufacturing an assembly structure according to some embodiments of the present disclosure.

Referring to FIG. 35, a portion of the second dielectric layer 23 and the third dielectric layer 25 is removed to form a cavity 20f through machining (e.g., laser drilling or lithography process). The cavity 20f extends through the second dielectric layer 23 and the third dielectric layer 25 to expose the first dielectric layer 21. Thus, from a cross-sectional view, the third dielectric layer 25 may have a turning point formed at the intersection of the top surface of the third dielectric layer 25 and the sidewall of the cavity 20f. In some embodiments, a portion of the first dielectric layer 21 may be also removed, thus, a top surface of the carrier 80 is exposed.

Figure 36:
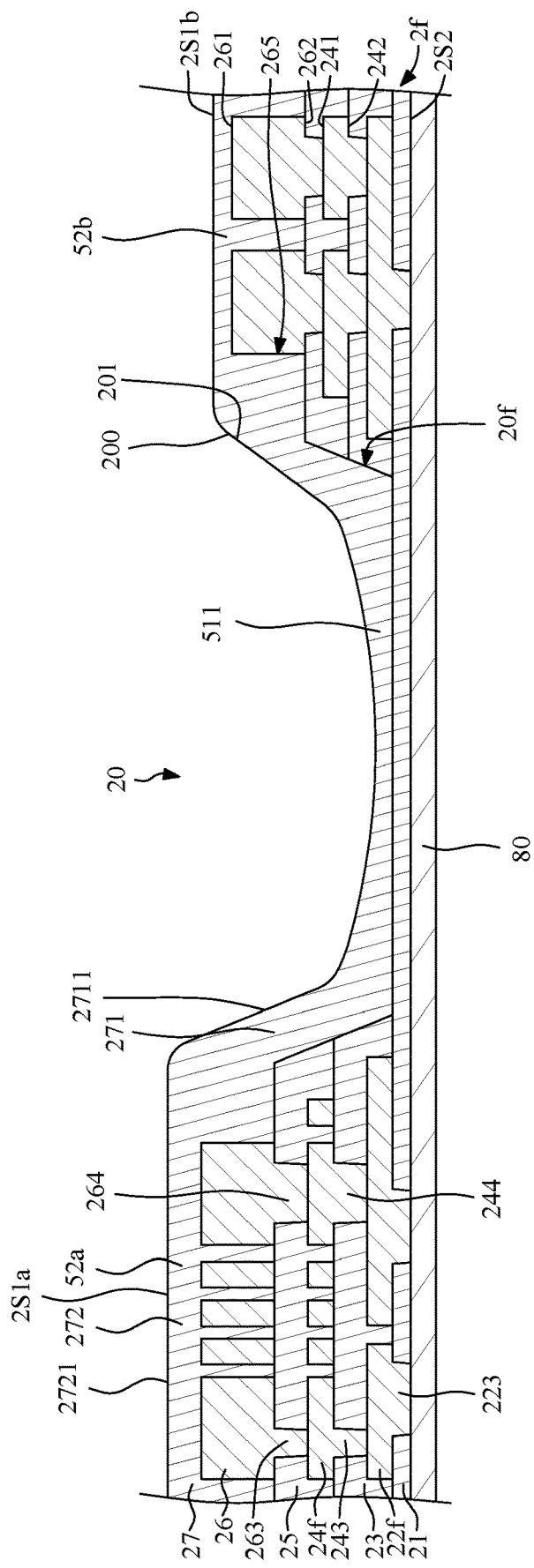
FIG. 36 illustrates one or more stages of an example of a method for manufacturing an assembly structure according to some embodiments of the present disclosure.

Referring to FIG. 36, a third circuit layer 26 is formed on the third dielectric layer 25. Then, a fourth dielectric layer 27 (also referred to as "an upper dielectric layer") is formed on the third dielectric layer 25 and the third circuit layer 26, and in the cavity 20f to form a die attach portion (i.e., the first lower portion 511) corresponding to the cavity 20f. That is, a first portion 271 of the fourth dielectric layer 27 may extend into the cavity 20f to form the die attach portion (i.e., the first lower portion 511), and define an accommodating recess 20.

Figure 37:
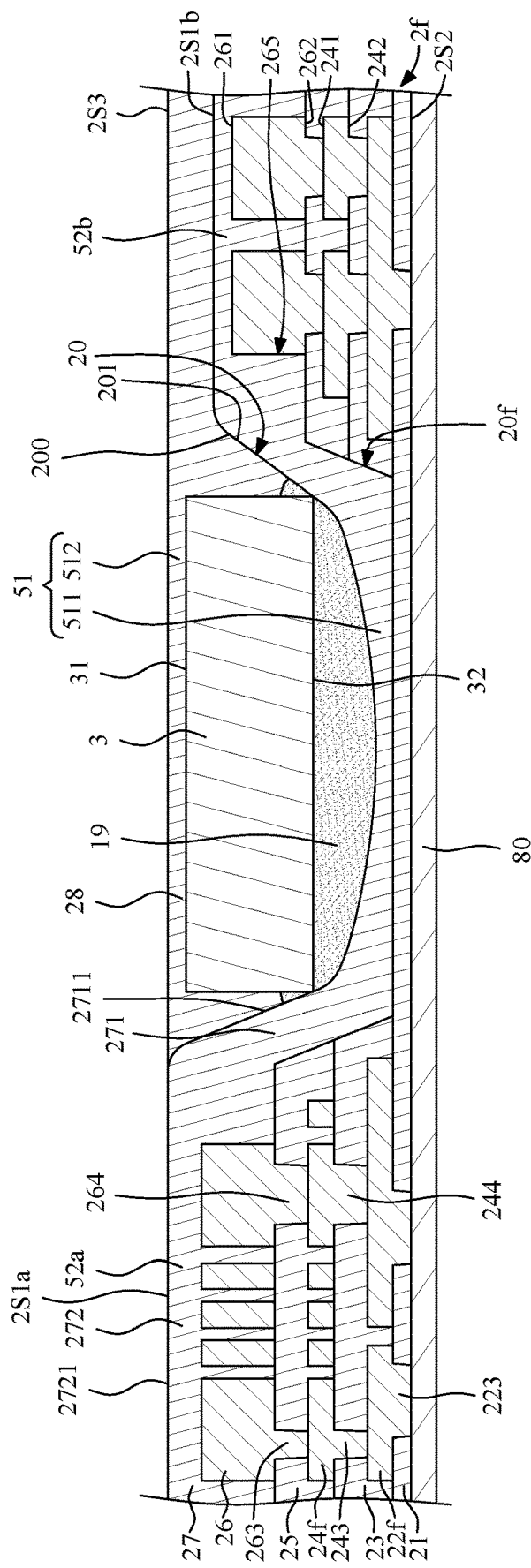
FIG. 37 illustrates one or more stages of an example of a method for manufacturing an assembly structure according to some embodiments of the present disclosure.

Referring to FIG. 37, a semiconductor element 3 is disposed on the die attach portion or in the accommodating recess 20. The bottom surface 32 of the semiconductor element 3 may be disposed on or attached to the surface 201 of the accommodating recess 20 through a buffer layer 19. Then, a protection material 28 is formed or disposed in the accommodating recess 20 to cover and encapsulate the semiconductor element 3 and the buffer layer 19.

Then, the following stages of the method may be similar to the stages illustrated in FIG. 27 to FIG. 31 so as to obtain the assembly structure if as shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An assembly structure, comprising:
   a wiring structure including at least one dielectric layer and at least one circuit layer in contact with the at least one dielectric layer, and defining an accommodating recess recessed from a top surface of the wiring structure, wherein the wiring structure has a smooth surface extending from the top surface of the wiring structure to a surface of the accommodating recess; and
   a semiconductor element disposed in the accommodating recess,
   wherein the wiring structure includes a first region and a second region located on two sides of the semiconductor element respectively, and an elevation of a top surface of the first region is different from an elevation of a top surface of the second region, wherein the first region includes a high conductive-trace density region and the second region includes a low conductive-trace density region, and the elevation of the top surface of the first region is higher than the elevation of the top surface of the second region.

2. The assembly structure of claim 1, wherein the wiring structure includes a first lower portion under the accommodating recess, and a number of the dielectric layer in the first lower portion is equal to a number of the dielectric layer of the wiring structure.

3. The assembly structure of claim 2, wherein the at least one circuit layer of the wiring structure is disposed in a second portion of the wiring structure, and a ratio of a thickness of the first lower portion to a thickness of the second portion is in a range from 0.156 to 0.67.

4. An assembly structure, comprising:
a wiring structure including at least one dielectric layer and at least one circuit layer in contact with the at least one dielectric layer, and defining an accommodating recess recessed from a top surface of the wiring structure, wherein the wiring structure has a smooth surface extending from the top surface of the wiring structure to a surface of the accommodating recess; and
a semiconductor element disposed in the accommodating recess,
wherein the surface of the accommodating recess includes a first slanted surface and a second slanted surface located on two sides of the semiconductor element respectively, wherein a first angle between the first slanted surface and a bottom surface of the wiring structure is different from a second angle between the second slanted surface and the bottom surface of the wiring structure.

5. The assembly structure of claim 4, wherein the first slanted surface corresponds to a high conductive-trace density region, the second slanted surface corresponds to a low conductive-trace density region, and the first angle is greater than the second angle.

6. The assembly structure of claim 1, further comprising a buffer layer disposed between a surface of the semiconductor element and the surface of the accommodating recess, wherein a thickness of a central portion of the buffer layer is greater than a thickness of a peripheral portion of the buffer layer.

7. An assembly structure, comprising:
a wiring structure including at least one dielectric layer and at least one circuit layer in contact with the at least one dielectric layer, and defining an accommodating recess recessed from a top surface of the wiring structure, wherein the wiring structure has a smooth surface extending from the top surface of the wiring structure to a surface of the accommodating recess;
a semiconductor element disposed in the accommodating recess;
a buffer layer disposed between a surface of the semiconductor element and the surface of the accommodating recess; and
a conductive through via extending through the buffer layer and the wiring structure, wherein the conductive through via tapers toward the semiconductor element.

8. An assembly structure, comprising:
a wiring structure including at least one dielectric layer and at least one circuit layer in contact with the at least one dielectric layer, and defining an accommodating recess recessed from a top surface of the wiring structure, wherein the wiring structure has a smooth surface extending from the top surface of the wiring structure to a surface of the accommodating recess;
a semiconductor element disposed in the accommodating recess; and
a fiducial mark disposed in the accommodating recess.

9. The assembly structure of claim 1, further comprising a protection material encapsulating the semiconductor element.

10. An assembly structure, comprising:
a wiring structure including at least one circuit layer disposed in a second portion of the wiring structure; and
a semiconductor element embedded in a first portion of the wiring structure, wherein a surface of the semiconductor element and an inner surface of the first portion of the wiring structure define a space, and a depth of a first portion of the space is greater than a depth of a second portion of the space, wherein the second portion of the space is nearer to the at least one circuit layer than the first portion of the space is.

11. The assembly structure of claim 10, wherein the inner surface of the first portion of the wiring structure includes a curved surface.

12. The assembly structure of claim 10, further comprising a buffer layer disposed in the space.

13. The assembly structure of claim 10, wherein a ratio of a distance between the inner surface of the first portion of the wiring structure and a bottom surface of the assembly structure to a thickness of the total assembly structure is in a range from 0.156 to 0.67.

14. The assembly structure of claim 10, further comprising a conductive through via extending through the buffer layer and a portion of the first portion of the wiring structure.

15. The assembly structure of claim 10, further comprising another semiconductor element embedded in the first portion of the wiring structure, wherein a surface of the another semiconductor element and the inner surface of the first portion of the wiring structure define another space, a depth of a first portion of the another space is greater than a depth of the second portion of the another space, wherein a first portion of the another space is nearer to the semiconductor element than a second portion of the another space is.

16. A method for manufacturing an assembly structure, comprising:
(a) providing a carrier;
(b) forming at least one dielectric layer and at least one circuit layer on the carrier to form a wiring structure, wherein the wiring structure includes a die attach portion and a circuit portion adjacent to the die attach portion, and a conductive-trace density of the circuit layer in the die attach portion is less than a conductive-trace density of the circuit layer in the circuit portion;
(b1) forming a fiducial mark on the die attach portion; and
(c) disposing a semiconductor element on the die attach portion.

17. A method for manufacturing an assembly structure, comprising:
(a) providing a carrier;
(b) forming at least one dielectric layer and at least one circuit layer on the carrier to form a wiring structure, wherein the wiring structure includes a die attach portion and a circuit portion adjacent to the die attach portion, and a conductive-trace density of the circuit layer in the die attach portion is less than a conductive-trace density of the circuit layer in the circuit portion;

wherein (b) includes:
(b1) removing at least a portion of the dielectric layer to form a cavity; and
(b2) forming an upper dielectric layer on the dielectric layer and in the cavity of (b1) to form the die attach portion corresponding to the cavity; and
(c) disposing a semiconductor element on the die attach portion.

\* \* \* \* \*